US 9,921,551 B2

(12) United States Patent
Honda

(10) Patent No.: US 9,921,551 B2
(45) Date of Patent: Mar. 20, 2018

(54) ELECTRONIC DEVICE, AND CONTROL METHOD OF AN ELECTRONIC DEVICE

(71) Applicant: Seiko Epson Corporation, Tokyo (JP)

(72) Inventor: Katsuyuki Honda, Miyata-Mura (JP)

(73) Assignee: Seiko Epson Corporation (JP)

( * ) Notice: Subject to any disclaimer, the term of this patent is extended or adjusted under 35 U.S.C. 154(b) by 96 days.

(21) Appl. No.: 15/010,541

(22) Filed: Jan. 29, 2016

(65) Prior Publication Data

US 2016/0223995 A1 Aug. 4, 2016

(30) Foreign Application Priority Data

Feb. 4, 2015 (JP) ................................. 2015-020244

(51) Int. Cl.
*G04F 10/00* (2006.01)
*G04R 20/02* (2013.01)
*G04R 60/14* (2013.01)
G04C 10/04 (2006.01)
G01R 31/36 (2006.01)

(52) U.S. Cl.
CPC ............. *G04R 20/02* (2013.01); *G04F 10/00* (2013.01); *G04R 60/14* (2013.01); G01R 31/362 (2013.01); G04C 10/04 (2013.01)

(58) Field of Classification Search
CPC .......... G04G 5/00; G04G 21/04; G04C 10/04; G04R 20/02; G04R 31/362; G04F 10/00; G01R 31/362
See application file for complete search history.

(56) References Cited

U.S. PATENT DOCUMENTS

| | | | | |
|---|---|---|---|---|
| 2007/0097795 A1* | 5/2007 | Hosobuchi | ........... | G04B 19/247 368/37 |
| 2013/0051185 A1* | 2/2013 | Honda | .................. | G04G 19/08 368/47 |
| 2013/0051188 A1* | 2/2013 | Akiyama | ............... | G04R 20/04 368/47 |
| 2015/0268634 A1 | 9/2015 | Honda | | |

FOREIGN PATENT DOCUMENTS

| | | |
|---|---|---|
| JP | 2010-096523 A | 4/2010 |
| JP | 2015-194458 A | 11/2015 |

* cited by examiner

*Primary Examiner* — Sean Kayes
(74) *Attorney, Agent, or Firm* — Harness, Dickey & Pierce, P.L.C.

(57) ABSTRACT

An electronic timepiece has a receiving device that receives satellite signals; a reception control unit that operates the receiving device and runs a reception process; a chronograph unit that executes a measuring process; an input device; a detection device that detects operation of the input device to start the chronograph, and outputs a chronograph operation signal when this operation is detected; a hand used both to indicate information related to the reception process and information related to the measuring process; and an operating control unit that operates the chronograph unit in addition to the operating reception control unit, and controls operation of the hand that is indicating information related to the reception process to indicate the measured time, if the chronograph operation signal is input while the reception process is running.

10 Claims, 15 Drawing Sheets

ELECTRONIC DEVICE, AND CONTROL METHOD OF AN ELECTRONIC DEVICE

BACKGROUND

1. Technical Field

The present invention relates to an electronic timepiece and a control method of an electronic timepiece for receiving satellite signals and measuring time.

2. Related Art

Electronic timepieces that receive and acquire time information from satellite signals transmitted from GPS (Global Positioning System) satellites, update the internal time based on the acquired time information, and have a chronograph function for measuring time are known from the literature. See, for example, JP-A-2010-96523.

The GPS wristwatch described in JP-A-2010-96523 start receiving satellite signals in a timekeeping means or navigation (positioning) mode in response to a manual operation or automatically at a specific time. In addition to displaying the time with an hour hand, minute hand, and second hand, this GPS wristwatch also has a stopwatch function (chronograph function) for measuring and displaying elapsed time with a center hand. In addition to displaying elapsed time, this center hand is also used to indicate that a satellite signal is being received when receiving satellite signals.

JP-A-2010-96523 is silent, however, about the GPS wristwatch using the reception function to receive satellite signals and using the chronograph function at the same time. Simultaneously executing the reception process and running the chronograph is difficult in a wristwatch because of the small size of the battery. However, recent improvements in power conservation and battery technologies potentially enable using the reception function and the chronograph function simultaneously. As a result, an electronic timepiece that can appropriately control operation of a hand that is used for both functions and improve ease of use when the reception process and the chronograph function are used simultaneously is needed.

SUMMARY

An objective of the present invention is to provide an electronic timepiece that has a satellite signal reception function and a time measuring function and improves ease of use, and a control method of the electronic timepiece.

An electronic timepiece includes: a reception unit configured to receive satellite signals; a reception control unit configured to operate the reception unit and execute a reception process; a measurement unit configured to execute a measuring process to measure time; an operating unit; a detection unit configured to detect a measurement operation of the operating unit instructing executing the measuring process, and outputting a chronograph operation signal when the measurement operation is detected; a hand used to indicate information related to the reception process and to indicate information related to the measuring process; and a control unit configured to operate the measurement unit in addition to the operating reception control unit, and control operation of the hand indicating the information related to the reception process to indicate the information related to the measuring process, if the chronograph operation signal output from the detection unit is input while the reception process is running.

The hand may indicate the number of GPS satellites locked as an example of information related to the reception process, and may indicate the measured time as an example of information related to the measuring process.

When the reception process is executed in this aspect, the hand indicates information related to the reception process. When the reception process is running and the chronograph operation signal is output from the detection unit, the measurement unit is driven in addition to the already-operating reception control unit, and the hand indicates information related to the measuring process.

As a result, by operating the operating unit to start the measurement operation while the reception process is running, the user can start measuring time at the desired time and can check the information related to the measuring process. Measuring time must start immediately whenever the user wants to start measuring. The user usually does not continuously check the information related to the reception process while the reception process is running, but because the information related to the measuring process, such as the stopwatch time, changes as time passes, when measuring time while checking the information related to the measuring process, the user typically wants to be able to constantly check the information related to the measuring process while the measuring process is running. The ease of use of the electronic timepiece can therefore be improved by being able to start the stopwatch at any time and continuously check the information related to the measuring process.

Furthermore, because the reception process continues even if the chronograph operation signal is output from the detection unit and the measurement unit operates while the reception process is running, opportunities to acquire time information from the satellite signals will not be lost.

Furthermore, because one hand is used to indicate both information related to the reception process and information related to the measuring process, the electronic timepiece can have fewer hands than when a hand for indicating information related to the reception process and a separate hand for indicating information related to the measuring process are both provided.

An electronic timepiece according to another aspect has a reception unit configured to receive satellite signals; a reception control unit configured to operate the reception unit and execute a reception process; a measurement unit configured to execute a measuring process to measure time; a hand used to indicate information related to the reception process and to indicate information related to the measuring process; and a control unit configured to operate the reception control unit in addition to the operating measurement unit, and control operation of the hand to indicate the information related to the measuring process, if a condition to automatically receive the satellite signal is met while the measuring process is running.

Examples of an automatic reception condition being met include reaching an operating time set at a specific interval, and the amount of light incident to the electronic timepiece exceeding a specific level enabling determining that the electronic timepiece is exposed to sunlight, that is, that the electronic timepiece is outdoors. Note that the number of times the reception process runs when the amount of light incident to the electronic timepiece is greater than or equal to the specific level may be limited to, for example, once a day.

In this aspect, the hand indicates information related to the measuring process when the measuring process is executed. If an automatic reception condition is met while the measuring process is running, the reception control unit operates in addition to the already-operating measurement unit, and the hand continues to indicate information related to the measuring process.

As a result, the ease of use of the electronic timepiece can be improved because measurement of time continues and information related to the measuring process can be read by the user even if an automatic reception condition is met and the reception process starts while the measuring process is running.

Furthermore, because the reception control unit operates and the reception process is executed if an automatic reception condition is met while the measurement unit is operating, opportunities to acquire time information from the satellite signals will not be lost.

Furthermore, because one hand is used to indicate both information related to the reception process and information related to the measuring process, the electronic timepiece can have fewer hands than when a hand for indicating information related to the reception process and a separate hand for indicating information related to the measuring process are both provided.

An electronic timepiece according to another aspect preferably also has a light detection unit configured to detect the amount of light incident to the electronic timepiece; the condition to automatically receive the satellite signal being the amount of light detected by the light detection unit being greater than or equal to a specific light level.

Thus comprised, the reception process executes if the amount of light incident to the electronic timepiece exceeds a specific level enabling determining that the electronic timepiece is exposed to sunlight, that is, that the electronic timepiece is outdoors. In this case, there is a strong possibility that the reception process will execute when the electronic timepiece is outdoors, and the probability that time information can be acquired is high. Furthermore, because time information can be acquired in a relatively short time, the operating time of the reception control unit can be shortened and the length of time the reception control unit and the chronograph unit operate simultaneously can be shortened. Power can therefore be conserved and the processor load can be reduced.

An electronic timepiece according to another aspect preferably also has an operating unit; and a detection unit configured to detect a receive operation of the operating unit instructing executing the reception process, and output a reception operation signal when the receive operation is detected; the control unit operating the reception control unit in addition to the operating measurement unit, and controlling the hand to indicate the information related to the measuring process, if the reception operation signal output from the detection unit is input while the measuring process is running.

Thus comprised, when the measuring process is executed, the hand indicates information related to the measuring process. If the reception operation signal is output while the measuring process is running, the reception control unit operates in addition to the already-operating measurement unit, and the hand continues to indicate information related to the measuring process.

As a result, if the user wants to run the reception process while measuring time, the user can simply manipulate the operating unit to start the reception process.

In an electronic timepiece according to another aspect, if the reception process and the measuring process are executing and the measuring process ends, the control unit controls operation of the hand to indicate the information related to the reception process.

If the reception process and the measuring process are executing simultaneously, and the measuring process ends first, the hand goes automatically from indicating information related to the measuring process to indicate information related to the reception process. As a result, the user can get information related to the reception process without needing to operate the operating unit.

In an electronic timepiece according to another aspect, the control unit controls operation of the hand to indicate the result of the reception process if the reception process and the measuring process are executing, the reception process ends, and the measuring process ends after the reception process ends.

If the reception process and the measuring process are executing simultaneously, the reception process ends first, and the measuring process then ends, the hand goes automatically from indicating information related to the measuring process to indicate information related to the reception process. As a result, the user can check the reception result without needing to operate the operating unit.

An electronic timepiece according to another aspect preferably also has a display unit configured to indicate that satellite signals are being received, and to display information other than that satellite signals are being received; the control unit controlling the display unit to display that satellite signals are being received when the reception process and the measuring process are running.

Display of information other than displaying that reception is in progress includes, for example, displaying time information.

Thus comprised, if the reception process and measuring process are executing simultaneously and the hand is indicating information related to the measuring process, the user can know that satellite signals are being received because the display unit displays information indicating that satellite signals are being received. As a result, the user can therefore avoid actions that may interfere with receiving satellite signals, such as moving from outdoors to indoors or covering the electronic timepiece with something through which satellite signals may not pass. The likelihood of successfully acquiring time information can therefore be improved.

Furthermore, because the display unit is used to display the time or other information other than that signals are being received, construction of the electronic timepiece is simplified compared with a configuration having a dedicated display unit for displaying only that satellite signals are being received.

An electronic timepiece according to another aspect preferably also has: an operating unit; and a detection unit configured to detect a change display operation of the operating unit that instructs changing the display; the control unit controlling operation of the hand to switch displaying the information related to the reception process and the information related to the measuring process if the change display operation output from the detection unit is input while the reception process and the measuring process are running.

Thus comprised, when the reception process and the measuring process are executing simultaneously, and the hand is indicating information related to the measuring process, the user may want to check information related to the reception process if the time measurement process will continue for some time. In this event, the user can simply perform the change display operation with the operating unit, and can check the information related to the reception process. After checking the information related to the reception process, the change display operation can be performed again to check the information related to the measuring process again.

An electronic timepiece according to another aspect preferable also has a battery; and battery reserve detection unit configured to detect the battery voltage or the remaining capacity of the battery. If the reception control unit is operating and a signal instructing operation of the measurement unit is input, or if the measurement unit is operating and a signal instructing operation of the reception control unit is input or a condition for operating the reception control unit is met: the control unit compares the detection value of the battery reserve detection unit with a previously set threshold, operates the reception control unit and the measurement unit if the detection value is greater than or equal to the threshold, ends operation of the reception control unit and starts operation of the measurement unit if the detection value is less than the threshold, and does not start operation of the reception control unit if the detection value is less than the threshold and the measurement unit is operating.

If the detection value output by the battery reserve detection unit is less than the threshold, simultaneous operation of the reception control unit and the measurement unit is prevented. Because power consumption can therefore be reduced compared with when the reception control unit and measurement unit operate simultaneously, the electronic timepiece can be prevented from unexpectedly shutting down and the duration time of the battery can be increased.

Furthermore, because measuring time must start immediately when the user wants to start measurement, the reception process can execute after the measuring process ends. As a result, the electronic timepiece is easier to use because the measurement unit operates with priority over the reception control unit.

Another aspect is a control method of an electronic timepiece including a reception unit configured to receive satellite signals, a reception control unit configured to operate the reception unit and execute a reception process, a measurement unit configured to execute a measuring process to measure time, an operating unit, a detection unit configured to detect a measurement operation of the operating unit instructing executing the measuring process, and outputting a chronograph operation signal when the measurement operation is detected, and a hand used to indicate information related to the reception process and to indicate information related to the measuring process, the control method including: operating the measurement unit in addition to the operating reception control unit, and controlling operation of the hand indicating the information related to the reception process to indicate the information related to the measuring process, if the chronograph operation signal is output from the detection unit while the reception process is running.

Another aspect is a control method of an electronic timepiece including a reception unit configured to receive satellite signals, a reception control unit configured to operate the reception unit and execute a reception process, a measurement unit configured to execute a measuring process to measure time, and a hand used to indicate information related to the reception process and to indicate information related to the measuring process, the control method including: operating the reception control unit in addition to the operating measurement unit, and operating the hand to indicate the information related to the measuring process, if a condition to automatically receive the satellite signal is met while the measuring process is running.

The control method of an electronic timepiece has the same effect as the electronic timepiece described above.

Other objects and attainments together with a fuller understanding of the invention will become apparent and appreciated by referring to the following description and claims taken in conjunction with the accompanying drawings.

DESCRIPTION OF EMBODIMENTS

A preferred embodiment is described below with reference to the accompanying figures.

Embodiment 1

Basic Configuration of a GPS System Including an Electronic Timepiece

Figure 1:
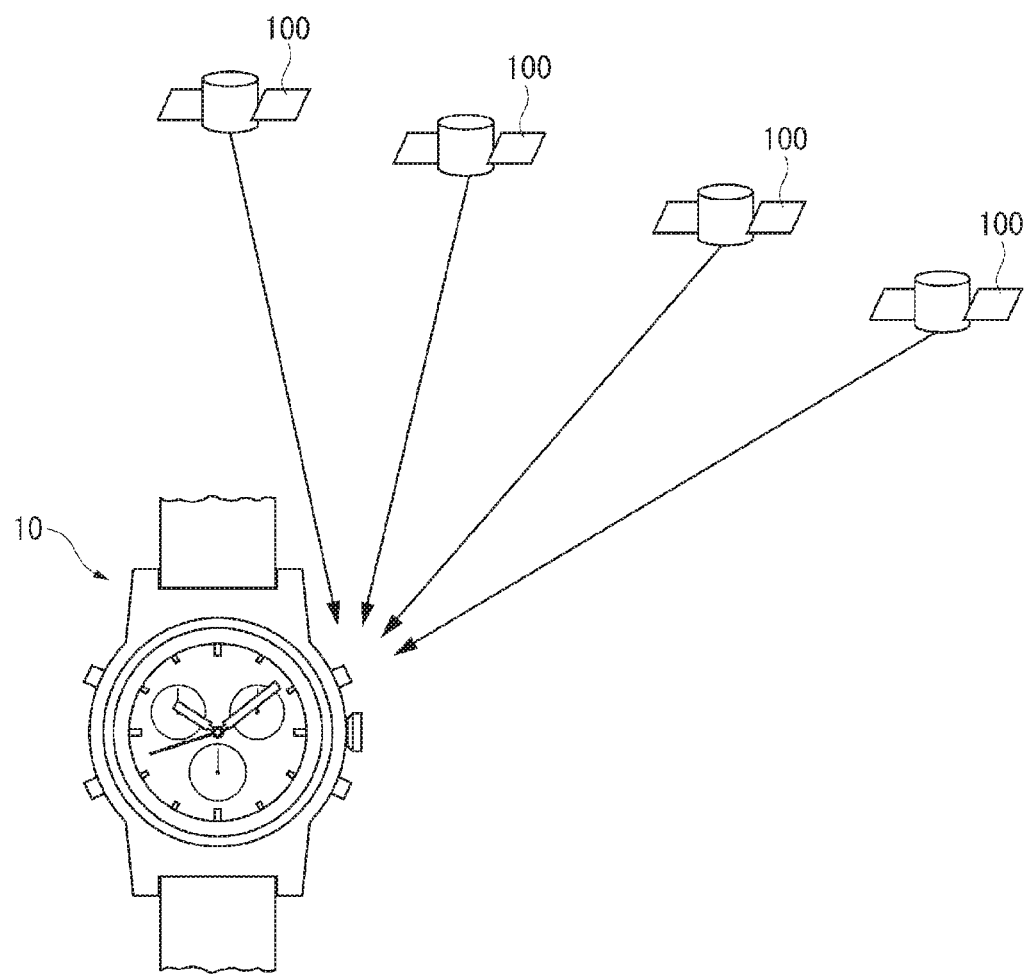
FIG. 1 schematically illustrates use of an electronic timepiece according to a first embodiment.

FIG. 1 illustrates a GPS system including an electronic timepiece 10. The basic configuration of the GPS system whereby an electronic timepiece 10 acquires location information and time information for the current location from satellite signals is described first.

The electronic timepiece 10 in this embodiment is a wristwatch that receives satellite signals (RF signals) from GPS satellites 100 and adjusts the internal time, and displays the current time based on the satellite signals on the opposite side of the wristwatch (the face) as the side of the wristwatch worn in contact with the wrist (the back).

The GPS satellites 100 are navigational satellites that orbit the Earth in space on specific orbits, and broadcast a navigation message superimposed on a 1.57542 GHz carrier wave (L1 wave). For brevity below, the 1.57542 GHz carrier wave to which the navigation message is superimposed is referred to as the satellite signal. The satellite signals are right-hand circularly polarized waves.

There are presently approximately 30 GPS satellites 100 in orbit (only 4 are shown in FIG. 1), and to identify which of the GPS satellites 100 transmitted the received satellite signal, a unique 1023 chip (1 ms) pattern called a C/A code (Coarse/Acquisition Code) is superimposed by each GPS satellite 100. Each chip in the C/A code denotes a +1 or −1, and the C/A code appears as a pseudorandom pattern. Therefore, by determining the correlation between the satellite signal and the pattern of each C/A code, the C/A code superimposed in a particular satellite signal can be detected.

Each GPS satellite 100 carries an atomic clock, and extremely precise GPS time information that is kept by the atomic clock is embedded in each satellite signal. The slight time difference between the atomic clocks carried by the GPS satellites 100 is measured by a land-based control segment, and a time correction parameter for correcting the particular time difference is included in each satellite signal.

The electronic timepiece 10 receives a satellite signal transmitted from one GPS satellite 100, and sets the internal time of the electronic timepiece 10 to the precise time (time information) obtained using the GPS time information and time correction parameter contained in the received satellite signal.

Orbit information identifying the location of the GPS satellite 100 on its orbit is also contained in the satellite signal. The electronic timepiece 10 performs a positioning calculation using the GPS time information and orbit information. This positioning calculation assumes there is a certain amount of error in the internal time of the electronic timepiece 10.

More specifically, in addition to the x, y, z parameters for acquiring the location of the electronic timepiece 10 in three dimensions, the time difference is also an unknown variable. The electronic timepiece 10 therefore generally receives satellite signals transmitted from four or more GPS satellites 100, and runs the positioning calculation using the GPS time information and orbit information contained in the received satellite signals to determine the location information of the current location.

Configuration of the Electronic Timepiece

Figure 2:
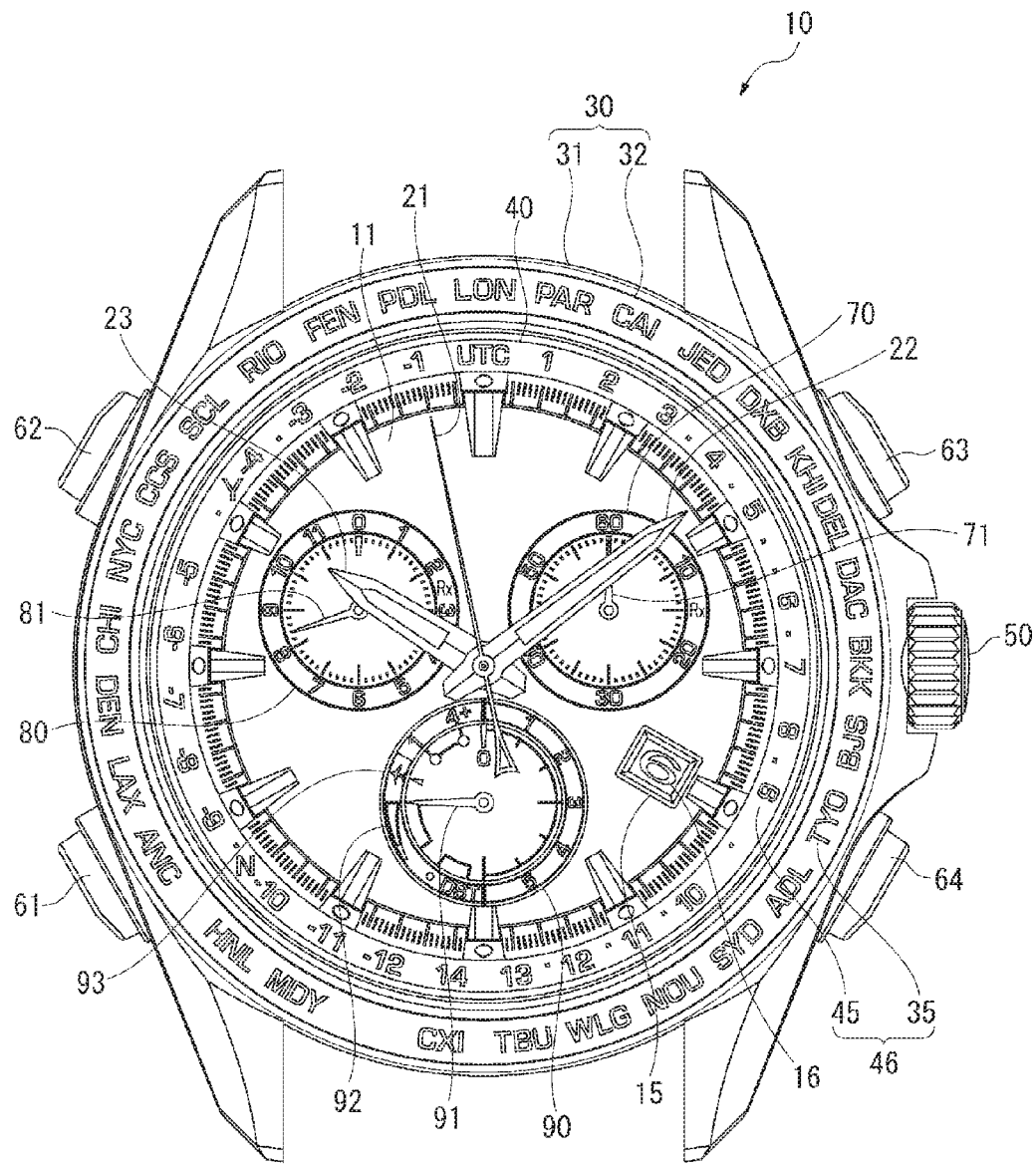
FIG. 2 is a plan view of the electronic timepiece according to the first embodiment.
Figure 3:
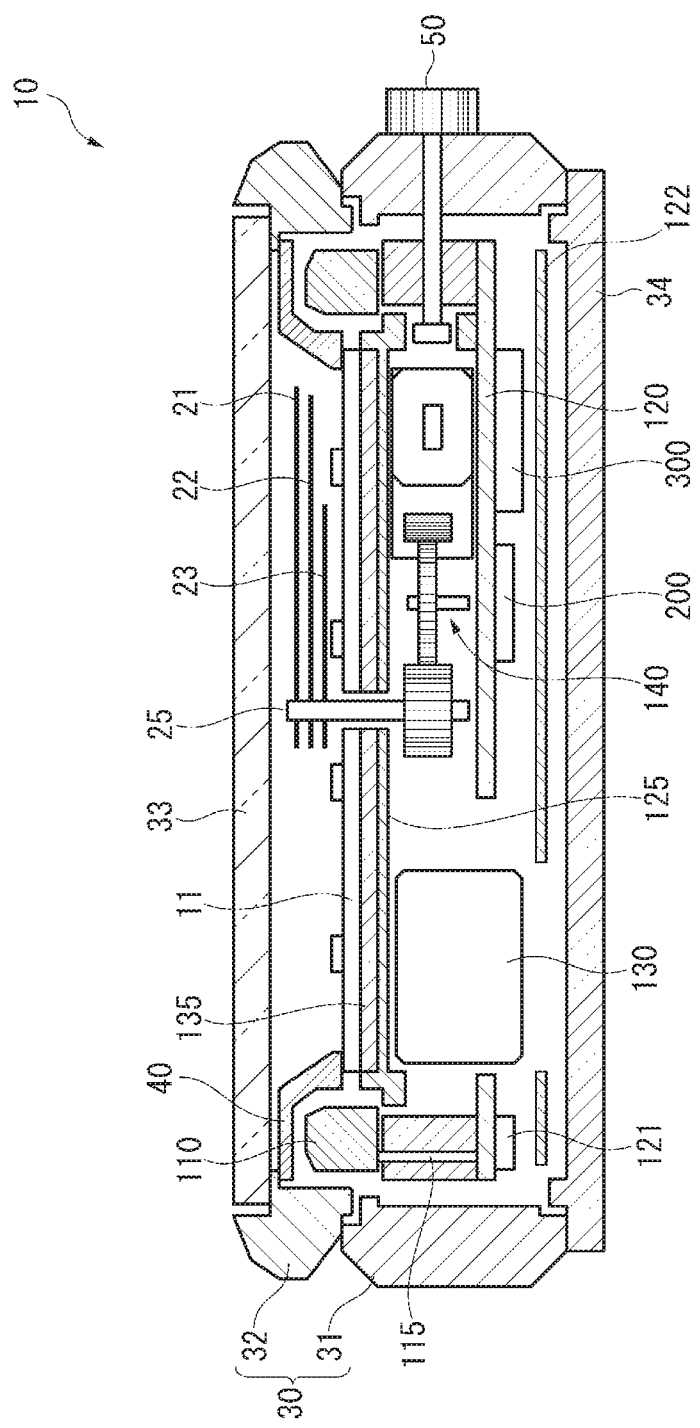
FIG. 3 is a section view of the electronic timepiece according to the first embodiment.

FIG. 2 is a plan view of the face of the electronic timepiece 10, and FIG. 3 is a section view of the electronic timepiece 10. In addition to being able to receive satellite signals, the electronic timepiece 10 according to this embodiment has a chronograph function.

As shown in FIG. 2 and FIG. 3, the electronic timepiece 10 has an external case 30, crystal 33, and back cover 34.

The external case 30 includes a ceramic bezel 32 affixed to a cylindrical case member 31 made of metal. A round dial 11 for displaying the time is held inside the inside circumference of the bezel 32 by means of a plastic dial ring 40.

Hands 21, 22, 23 are disposed above the dial 11. Around the center of the dial 11 are further disposed a round first subdial 70 and hand 71 at 2:00; a round second subdial 80 and hand 81 at 10:00; a round third subdial 90 and hand 91 at 6:00; and a rectangular calendar window 15 at 4:00. The dial 11, hands 21, 22, 23, first subdial 70, second subdial 80, third subdial 90, and calendar window 15 can be seen through the crystal 33.

A calendar wheel 16 (date wheel) is disposed on the back side of the dial 11, and this calendar wheel 16 can be seen through the calendar window 15.

In the side of the external case 30 around the center of the dial 11 are also disposed a button A 61 at 8:00; a button B 62 at 10:00; a button C 63 at 2:00; a button D 64 at 4:00; and a crown 50 at 3:00. When the button A 61, button B 62, button C 63, button D 64, and crown 50 are operated, operating signals corresponding to the specific operation are output.

As shown in FIG. 3, of the two main openings in the metal external case 30, the opening on the face side of the electronic timepiece 10 is covered by the crystal 33 held by the intervening ceramic bezel 32, and the opening on the back side is covered by the metal back cover 34.

Disposed inside the external case 30 are the dial ring 40 attached to the inside circumference of the ceramic bezel 32; a light transparent dial 11; a center arbor 25 that passes through the dial 11; the hands 21, 22, 23 that rotate on the center arbor 25; and a drive mechanism 140 that drives the hands 21, 22, 23, the hands 71, 81, 91, and the calendar wheel 16.

The center arbor 25 passes through the plane center of the external case 30 on the center axis between the face and back of the timepiece.

The dial ring 40 has a flat portion of which the outside edge contacts the inside circumference surface of the ceramic bezel 32 and one surface is parallel to the crystal 33; and a beveled portion that slopes toward the dial 11 so that the inside edge contacts the dial 11. The dial ring 40 is ring-shaped when seen in plan view, and conically shaped when seen in section view. A donut-shaped storage space is formed by the flat portion and the beveled portion of the dial ring 40, and the inside circumference surface of the ceramic bezel 32. A ring-shaped antenna 110 is housed in this storage space.

The antenna 110 has a ring-shaped dielectric base on which a metal antenna pattern is formed by a plating or silver paste printing process. The antenna 110 is disposed around the perimeter of the dial 11 and the inside circumference side of the ceramic bezel 32, is covered by the plastic dial ring 40 and crystal 33, and can therefore assure good reception. The dielectric in this embodiment is molded from a titanium oxide or other high frequency dielectric material mixed with resin, and enables rendering a small antenna by using the wavelength-shortening effect of the dielectric.

The dial 11 is a round disc for indicating the time inside the external case 30, is made from plastic or other light transmissive material, and is disposed inside the dial ring 40 with the hands 21, 22, 23 between the dial 11 and the crystal 33.

A photovoltaic solar panel 135 is disposed between the dial 11 and the main plate 125 to which the drive mechanism 140 is attached. The solar panel 135 is a round panel having a plurality of solar cells (photovoltaic elements) that convert light energy to electrical energy connected in series. The solar panel 135 also has a sunlight detection function. Holes through which the center arbor 25, arbors (not shown in the figure) for the hand 71 of the first subdial 70, the hand 81 of the second subdial 80, and the hand 91 of the third subdial 90 pass, and the aperture of the calendar window 15, are formed in the dial 11, the solar panel 135, and the main plate 125.

The drive mechanism 140 is attached to the main plate 125, and is covered on the back side by a circuit board 120. The drive mechanism 140 has a stepper motor, wheels and wheel trains, and drives the hands by the stepper motor turning the center arbor 25 through the wheel train.

The drive mechanism 140 more specifically includes first to sixth drive mechanisms. The first drive mechanism drives the minute hand 22 (minute hand) and hour hand 23 (hour hand) that indicate the hour and minute of the internal time (current time). The second hand 21, the hand 71 of the first subdial 70, the hand 81 of the second subdial 80, and the hand 91 of the third subdial 90 are driven by like drive mechanisms (not shown in the figure). More specifically, the second drive mechanism drives the second hand 21 (chronograph second hand) that indicates the second of the chronograph function; the third drive mechanism drives the hand 71 (chronograph minute hand) that indicates the minute of the chronograph function; the fourth drive mechanism drives the hand 81 (small second hand) that indicates the second of the internal time; the fifth drive mechanism drives the hand 91 (chronograph hour hand) that indicates the hour of the chronograph function; and the sixth drive mechanism drives the calendar wheel 16 that is visible through the calendar window 15.

The circuit board 120 has a reception device (GPS module) 121, a control device 300, and a storage device 200. The reception device 121 is an example of the reception unit. The circuit board 120 and antenna 110 connect through an antenna connection pin 115. A circuit cover 122 covers the reception device 121, control device 300, and storage device 200 from the back cover 34 side of the circuit board 120 to which these parts are disposed. A lithium ion battery or other type of storage battery 130 is disposed between the main plate 125 and the back cover 34. The storage battery 130 is charged with power produced by the solar panel 135.

The antenna 110 is powered through a power supply node, and the antenna connection pin 115 disposed on the back side of the antenna 110 is connected to this power supply node. The antenna connection pin 115 is a metal pin-shaped connector that is disposed to the circuit board 120 and passes through a through-hole formed in the main plate 125 into the storage space. The circuit board 120 and the antenna 110 inside the storage space are connected to the antenna connection pin 115.

Electronic Timepiece Display Mechanism

As shown in FIG. 2, a scale dividing the outside circumference into 60 divisions, each of which is subdivided into a ⅕ scale of 5 divisions, is formed around the outside perimeter of the dial 11. Using this scale, the second hand 21 indicates the seconds of the chronograph function as information related to the counting process for measuring time. This information can be displayed by the user operating button C and causing the electronic timepiece 10 to execute the chronograph control process described below.

A scale dividing the outside perimeter of the dial 11 into 12 divisions is also provided. Using this scale, the second hand 21 indicates the number of GPS satellites 100 that the electronic timepiece 10 has locked onto (number of locked satellites) as information related to the reception process for receiving satellite signals. Note that the electronic timepiece 10 in this embodiment has a 12-channel receiver circuit so that up to twelve satellite signals can be simultaneously locked and received. The second hand 21 is therefore configured so that it can indicate a number of locked satellites up to 12. More specifically, if the number of locked satellites is 1, 2, 3, or 12, for example, the second hand 21 points to 1:00, 2:00, 3:00, or 12:00. The second hand 21 indicates the number of locked satellites when the electronic timepiece 10 is running the reception process and is not executing the chronograph control process.

The second hand 21 is thus an example of the hand that is used both to indicate information related to the reception process, and information related to a timekeeping function.

The markers on the outside perimeter of the dial 11 are also used by the minute hand 22 to indicate the minute of the internal time, and by the hour hand 23 to indicate the hour of the internal time.

A scale of 60 divisions with numeric markers 10 to 60 at increments of 10 are disposed around the outside of the round first subdial 70 on the dial 11. The hand 71 of this first subdial 70 uses this scale to indicate the minute of the chronograph function. This information is displayed when the electronic timepiece 10 is running the chronograph control process.

The letters Rx are also shown between the 10 and the 20 markers of the first subdial 70. The hand 71 points to this Rx marker when the electronic timepiece 10 is receiving satellite signals from the GPS satellites 100. By pointing to this marker, the hand 71 shows that the reception process is running and satellite signals are being received. This display is used when the electronic timepiece 10 is running the reception process and is not running the chronograph control process.

When the electronic timepiece 10 is not executing the reception process or the chronograph control process, the hand 71 is stationary at the 0 minute position (the 60 marker).

A scale of 60 divisions with numeric markers 0 to 11 is disposed around the outside of the round second subdial 80 on the dial 11. The hand 81 of this second subdial 80 uses this scale to indicate the second of the internal clock.

The letters Rx meaning that satellite signals are being received from the GPS satellites 100 are also shown between the 2 and the 3 markers of the second subdial 80. The hand 81 points to this Rx marker when the electronic timepiece 10 is receiving satellite signals from the GPS satellites 100. This display is used when the electronic timepiece 10 is running the reception process and is also running the chronograph control process.

The hand 81 is an example of a display unit, and the second of the internal time is used to indicate information other than that the reception process is running.

The hand 81 indicates the second of the internal time when the electronic timepiece 10 is running the reception process and is not running the chronograph control process, and when running the chronograph control process but not the reception process.

The information indicated using the third subdial 90 of the dial 11 is described next. Note that below referring to the direction of n:00 (where n is a natural number) on the third subdial 90 means the position of that time on an imaginary clock dial centered on the pivot of the hand 91.

A scale of six divisions with numeric markers 0 to 5 is formed on the outside perimeter of the third subdial 90 from 12:00 to 6:00. Using this scale, the hand 91 indicates the hour of the chronograph function.

This displays is used when the electronic timepiece 10 is executing the chronograph control process. The chronograph function in this embodiment can count time to 5 hours 59 minutes 59 seconds using hands 21, 71, 91.

The letters DST and an open circle (O) are disposed to the third subdial 90 in the area from 6:00 to 7:00. DST denotes Daylight Saving Time. These markers are used to indicate if daylight saving time is being used (DST=the daylight savings time mode is on; O indicates the DST mode is off). The operator can set the DST mode of the electronic timepiece 10 on or off by operating the crown 50 and button B 62 to set the hand 91 to DST or O appropriately.

A sickle-shaped marker 92 that is wide at the base at 9:00 and narrows to the end at 7:00 is disposed along the outside edge of the third subdial 90 from 7:00 to 9:00. This marker 92 is a power indicator for the storage battery 130 (FIG. 3), and the hand 91 indicates a position at the base, middle, or distal end of the marker 92 according to the reserve power in the storage battery 130.

An airplane-shaped marker 93 is disposed in the area between 9:00 and 10:00 on the outside of the third subdial 90. This airplane marker 93 denotes an in-flight mode. Satellite signal reception is prohibited in some countries by aviation regulations during take-off and landing of an airplane. Satellite signal reception by the electronic timepiece 10 can be stopped by the user operating the button A 61 and setting the hand 91 to the airplane marker 93 (in-flight mode).

Numeric markers 1 and 4+ are disposed in the area from 10:00 to 12:00 on the outside of the third subdial 90. These markers are used to indicate the satellite signal reception mode. The 1 marker means that the GPS time information is received and the internal time corrected, and the 4+ marker means that GPS time information and orbit information are received, and the internal time and time zone described below are corrected. The hand 91 jumps to the 1 or the 4+ marker to indicate the satellite signal reception mode. Note that this display relates to the reception process when the electronic timepiece 10 is running the reception process and is not running the chronograph control process.

The user can also operate button A 61 to set the reception mode. More specifically, the time information reception mode (timekeeping mode) is set by setting the hand 91 to the 1 marker. The positioning information reception mode (positioning mode) is set by setting the hand 91 to the 4+ marker.

If the user uses the button B 62 to select the reception result display mode, the hand 91 jumps to the 1 or the 4+ marker to indicate the reception mode of the satellite signal that was just received by the electronic timepiece 10.

The calendar window 15 is a rectangular opening formed in the dial 11, and a number on the calendar wheel 16 can be seen through the calendar window 15. This number indicates the day value of the current date.

The relationship between Coordinated Universal Time (UTC), the time difference, standard time, and the time zone is described next.

A time zone denotes a geographical area that uses a common standard time, and there are currently 40 time zones around the world. Each time zone is distinguished by the time difference between the standard time used in the time zone and UTC. Japan, for example, belongs in a time zone using a standard time that is 9 hours ahead of UTC, or UTC+9. The standard time used in each time zone can be obtained from UTC and the time difference to UTC.

As described above, a scale divided into 60 minutes and seconds is formed on the dial 11, and time difference information 45 representing the time difference to UTC is indicated by numbers and non-numeric markers along the time scale on the dial ring 40 surrounding the outside perimeter of the dial 11. The numeric time difference information 45 denotes the integer value of the time difference, and the non-numeric time difference information 45 denotes a time difference that is not a whole number. The time difference between UTC and the internal time indicated by hands 22, 23, 81 can be checked by the time difference information 45 indicated by the second hand 21 by operating the crown 50.

City name information 35 is disposed beside the time difference information 45 on the bezel 32 surrounding the dial ring 40. The city name information 35 denotes the name of a city located in the time zone that uses the standard time corresponding to the time difference indicated by the time difference information 45 on the dial ring 40. The markers of the time difference information 45 and the city name information 35 embody a time zone display 46. The time zone display 46 in this embodiment has the same number of time zone markers as there are time zones used in the world today.

The letter Y is disposed to the dial ring 40 outside the 51-minute position on the dial 11, and the letter N is disposed outside the 38-minute position. These letters are used to indicate the result of acquiring information based on satellite signals received from the GPS satellites 100 (Y=reception succeeded, N=reception failed). The second hand 21 points to either Y or N to indicate the satellite signal reception result, that is, the information acquisition result, as information related to the reception process.

Note that the reception result is displayed when the electronic timepiece 10 has ended the reception process and the chronograph control process is not executing. This display is presented when the user operates the button B 62 and enters the reception result display mode.

Electrical Configuration of Electronic Timepiece

Figure 4:
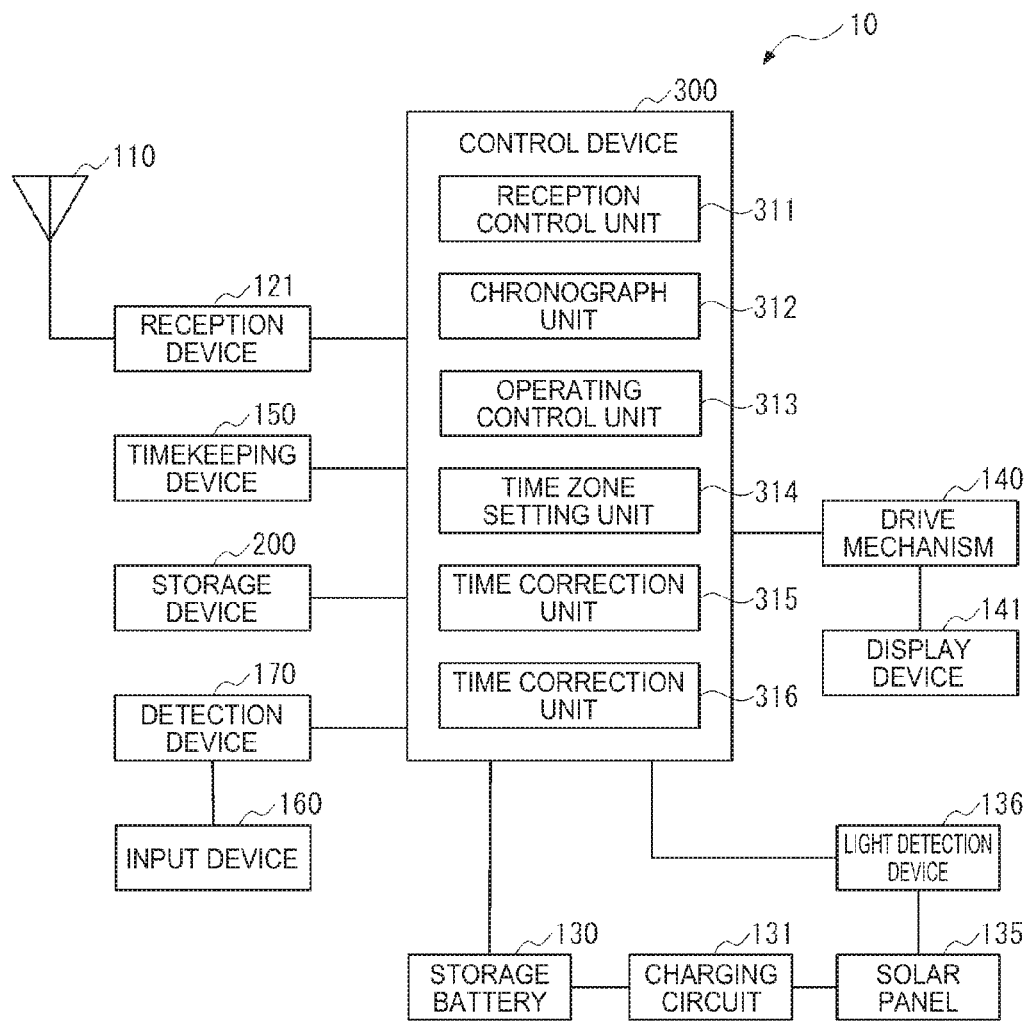
FIG. 4 is a block diagram of the electrical control circuit of the electronic timepiece according to the first embodiment.

FIG. 4 is a control block diagram of the electronic timepiece 10.

As shown in FIG. 4, the electronic timepiece 10 has a control device 300 comprising a CPU, a storage device 200 including RAM (random access memory) and ROM (read-only memory), a reception device 121, an input device 160, a detection device 170, the drive mechanism 140, a display device 141, and a timekeeping device 150. These devices communicate with each other over a data bus.

The input device 160 includes the crown 50, button A 61, button B 62, button C 63, and button D 64 shown in FIG. 2. The detection device 170 detects user operation of the input device 160, and outputs an operating signal corresponding to the detected operation to the control device 300 when an operation is detected. The input device 160 is an example of the operating unit, and the detection device 170 is an example of the detection unit.

The display device 141 includes the dial ring 40, bezel 32, and hands 21, 22, 23, 71, 81, 91 shown in FIG. 2.

The electronic timepiece 10 has a rechargeable storage battery 130 (see FIG. 3) as the power source. The storage battery 130 is charged by power produced by the solar panel 135 through a charging circuit 131.

Reception Device

The reception device 121 is connected to the antenna 110, processes satellite signals received through the antenna 110, and acquires GPS time information and positioning information. The antenna 110 receives satellite signals that are transmitted from the GPS satellites 100 (FIG. 1) orbiting the Earth on known orbits, and pass through the crystal 33 and dial ring 40 shown in FIG. 3.

While not shown in the figure, the reception device 121 includes an RF (radio frequency) unit that receives and converts satellite signals transmitted from the GPS satellites 100 (FIG. 1) to digital signals; a baseband unit that executes a reception signal correlation process and demodulates the navigation data message; and a data acquisition unit that acquires GPS time information and positioning information from the navigation data message (satellite signals) demodulated by the baseband unit.

The RF unit includes a bandpass filter, PLL circuit, IF filter, VCO (voltage controlled oscillator), ADC (A/D converter), mixer, LNA (low noise amplifier), and IF amplifier.

The satellite signal extracted by the bandpass filter is amplified by the LNA, mixed by the mixer with the signal from the VCO, and down-converted to an IF (intermediate frequency) signal. The IF signal mixed by the mixer then passes through the IF amplifier and IF filter, and is converted by the A/D converter to a digital signal.

The baseband unit has a local code generator and a correlation unit.

The local code generator generates local codes that are the same as the C/A codes used by the GPS satellites 100 for signal transmission.

The correlation unit calculates the correlation between the local codes and the reception signal output from the RF unit. If the correlation calculated by the correlation unit equals or exceeds a specific threshold, the C/A code used in the received satellite signal and the local code that was generated match, and the satellite signal can be locked (synchronized). The navigation message can therefore be demodulated by the correlation process using the received satellite signal and a local code.

The data acquisition unit acquires the GPS time information and location (positioning) information from the navigation message demodulated by the baseband unit. The navigation message contains preamble data, the TOW (Time of Week, also called the Z count) of the HOW word, and subframe data. There are five subframes, subframe 1 to subframe 5, and each subframe contains satellite correction data including a week number value and satellite health data, ephemeris data (detailed orbit information for a particular GPS satellite 100), and almanac data (basic orbit information for all GPS satellites 100). The data acquisition unit can therefore acquire the GPS time information and positioning information by extracting specific data from the received navigation message.

Subframes 4 and 5 contain orbit information for all satellites (almanac data) and ionospheric correction information, and this information is stored in subframes 4 and 5 over multiple pages because of the large amount of information. More specifically, the data carried in subframes 4 and 5 is divided over pages 1 to 25, and different page content is sequentially transmitted in each frame. Because 25 frames are required to transmit the content of all pages, 12 minutes 30 seconds is required to receive all of the information in the navigation message.

The leap second value is contained in page 18 of subframe 4, and the leap second information can be acquired by receiving page 18 in subframe 4.

Timekeeping Device

The timekeeping device 150 includes a crystal oscillator that is driven by power stored in the storage battery 130, and updates the time data using a reference signal based on the oscillation signal from the crystal oscillator.

Storage Device

Figure 5:
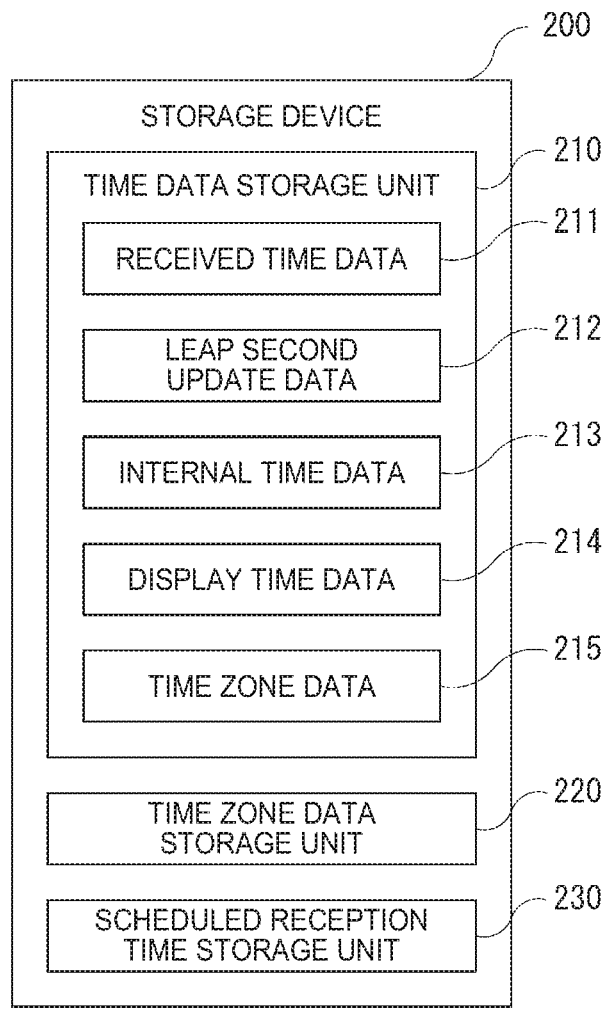
FIG. 5 illustrates the data structure of the storage device of the electronic timepiece according to the first embodiment.

The storage device 200, as shown in FIG. 5, includes a time data storage unit 210, a time zone data storage unit 220, and a scheduled reception time storage unit 230.

Stored in the time data storage unit 210 are received time data 211, leap second update data 212, internal time data 213, display time data 214, and time zone data 215.

The received time data 211 stores the time information (GPS time) acquired from GPS satellite signals. The received time data 211 is normally updated every second by the timekeeping device 150, and when a satellite signal is received, the acquired time information (GPS time) is stored.

The leap second update data 212 stores at least data about the current leap second. More specifically, the current leap second value, the week number of the leap second event, the day number of the leap second event, and the future leap second value, are stored on page 18 in subframe 4 of the GPS satellite signal as data related to the leap second. Of these values, at least the current leap second value is stored in the leap second update data 212.

More specifically, the internal time data 213 is updated based on the GPS time stored in the received time data 211 and the current leap second value stored in the leap second update data 212. As a result, UTC is stored in the internal time data 213. When the received time data 211 is updated by the timekeeping device 150, the internal time data is also updated.

The sum of the internal time stored in the internal time data 213, and the time zone data (time difference information) of the time zone data 215 is stored in the display time data 214. The time zone data 215 is set based on the positioning information acquired when the time zone is manually selected by the user or is acquired by reception in the navigation mode.

The time zone data storage unit 220 relationally stores positioning information (latitude, longitude) to time zone data (time difference information). As a result, when positioning information is acquired in the navigation mode, the control device 300 can acquire the time zone based on the positioning information (latitude, longitude).

City names and time zone data are also relationally stored in the time zone data storage unit 220. As a result, when the user uses the input device 160, such as the crown 55, to select the name of a particular city and acquire the current time in that city, the control device 300 searches the time zone data storage unit 220 for the city name selected by the user, acquires the time zone data for that city name, and set the time zone data 215.

The scheduled reception time for running the scheduled reception time process automatically as described below is stored in the scheduled reception time storage unit 230. The time when reception initiated by manually operating the button B 62 was last successful is stored as the scheduled reception time.

Note that orbit information (almanac, ephemeris) for the positioning information satellites is not stored in the storage device 200. The electronic timepiece 10 in this embodiment is a wristwatch, has limited storage capacity in the storage device 200, the capacity of the storage battery 130 is also limited, and continuing reception for the length of time required to acquire the orbit information is difficult. The reception process of the electronic timepiece 10 is therefore executed from a cold start when orbit information is not stored.

Control Device

The control device 300 is embodied by a CPU that controls the electronic timepiece 10. The control device 300 includes a reception control unit 311, chronograph unit 312, an operating control unit 313, a time zone setting unit 314, a time correction unit 315, and a time correction unit 316.

Operating Control Unit

The operating control unit 313 controls operation of the reception control unit 311 and the chronograph unit 312. The operating control unit 313 is an example of the control unit.

When the automatic reception condition is met, the operating control unit 313 drives the reception control unit 311 to operate. As a result, the reception control unit 311 operates the reception device 121 to automatically run the automatic reception process in the timekeeping mode.

The automatic reception process includes a scheduled reception process and a light-based automatic reception process.

More specifically, the operating control unit 313 operates the reception control unit 311 to execute the scheduled reception process in the timekeeping mode when the internal time reaches the scheduled reception time set for a specific interval. For example, when the display time data 214 reaches the scheduled reception time stored in the scheduled reception time storage unit 230 at an interval of once every three days, the operating control unit 313 drives the reception control unit 311 to run the scheduled reception time process in the timekeeping mode.

When the amount of light detected by the light detection device 136, which detects the amount of light incident to the electronic timepiece 10, reaches a specific threshold and the electronic timepiece 10 can be determined to be outdoors and exposed to daylight, the operating control unit 313 drives the reception control unit 311 to execute the light-based automatic reception process in the timekeeping mode.

The light detection device 136 detects the amount of light incident to the electronic timepiece 10 by, for example, detecting the output voltage or the output current from the solar panel 135. Note also that the number of times the reception device 121 is operated in the light-based automatic reception process may be limited to once a day, for example. The light detection device 136 is an example of the light detection unit.

When the automatic reception process executes, the reception device 121 locks onto at least one GPS satellite 100, receives satellite signals from that GPS satellite 100, and acquires time information.

The operating control unit 313 operates the reception control unit 311 based on the input device 160 being operated to instruct executing the reception process. The reception control unit 311 then drives the reception device 121 to run the reception process manually in the timekeeping mode or the positioning mode.

More specifically, if the user pushes button B 62 for 3 seconds or more and less than 6 seconds to manually start reception and a reception operation signal is input from the detection device 170, the operating control unit 313 operates the reception control unit 311 to run the reception process in the timekeeping mode.

When the manual reception process runs in the timekeeping mode, the reception device 121 locks onto at least one GPS satellite 100, receives satellite signals transmitted from that GPS satellite 100, and acquires time information.

If the button B 62 is pressed for 6 seconds or more to start reception, the operating control unit 313 drives the reception control unit 311 to execute the manual reception process in the positioning mode.

When the manual reception process runs in the positioning mode, the reception device 121 locks onto at least three and preferably four or more GPS satellites 100, receives satellite signals transmitted from those GPS satellites 100, and acquires positioning information. The reception device 121 can also acquire time information from the received satellite signals in this mode.

When the reception process is executed automatically or manually, the operating control unit 313 controls operation of the hands 21, 71, 91 to indicate information related to the reception process.

If satellite signal reception is successful and the time information or positioning information is acquired, or a specific time passes without receiving satellite signals succeeding (that is, if reception fails), the operating control unit 313 controls operation of the second hand 21 to indicate the result of satellite signal reception.

When button C 63 is pushed to start the chronograph function (stopwatch operation) and the chronograph operation signal is output from the detection device 170, the operating control unit 313 operates the chronograph unit 312. As a result, the chronograph unit 312 starts the stopwatch process to measure time. The chronograph unit 312 is an example of the stopwatch unit. The operating control unit 313 then controls operation of the hands 21, 71, 91 to indicate the time measured by the chronograph.

If the chronograph operation signal is input while a reception process is running, the operating control unit 313 operates the chronograph unit 312 in addition to the already-operating reception control unit 311, and controls the operation of the hands 21, 71, 91 that are indicating information related to the reception process to indicate the measured time (referred to below as the chronograph time). More specifically, the second hand 21 moves from the position indicating the number of locked satellites to indicate the chronograph second; hand 71 moves from the Rx marker position indicating reception is in progress to indicate the chronograph minute; and hand 91 moves from the marker 1 or 4+ indicating the reception mode to indicate the chronograph hour. The operating control unit 313 also controls the hand 81 to move from the second indicated by the hand 81 to the Rx marker indicating reception is in progress.

If the condition for running the automated reception process is met, or the reception operation signal is input, while the chronograph control process is executing, the operating control unit 313 operates the reception control unit 311 in addition to the already-operating chronograph unit 312, and indicates the chronograph time with the hands 21, 71, 91. In other words, the hands 21, 71, 91 continue to indicate the chronograph time. That reception is in progress is indicated by the hand 81. In other words, the hand 81 moves from the position indicating the second of the internal time to the Rx marker indicating reception.

If the reception process and the chronograph control process are running simultaneously, and the chronograph control process ends first, the operating control unit 313 controls operation of the hands 21, 71, 91 to display information related to the reception process. More specifically, the hands 21, 71, 91 move from the positions when the chronograph control process ended to respectively indicate the number of locked satellites, Rx, and either the 1 or 4+ marker. The operating control unit 313 also controls operation of the hand 81 to move from the Rx marker to the position indicating the current second of the current time. When the reception process then ends, the second hand 21 moves to indicate either Y or N as appropriate, and then moves to the 0 second position. Hand 71 goes to the 0 minute position, hand 91 goes to the position corresponding to the current power reserve of the battery, and hand 81 moves to the position indicating the second of the internal time.

If the reception process and the chronograph control process are running simultaneously, the reception process ends first, and the chronograph control process then ends, the operating control unit 313 controls operation of the second hand 21 to indicate the reception result. More specifically, the second hand 21 moves from the position when the chronograph control process ended to the appropriate Y or N marker. Hand 71 goes to the 0 minute position, hand 91 goes to the 1 or 4+ marker, and hand 81 moves to the position indicating the second of the internal time. The second hand 21 then moves to the 0 second position, and hand 91 moves to the position corresponding to the current power reserve of the battery.

Time Zone Setting Unit

When acquiring positioning information by the reception control unit 311 in the manual reception process in the timekeeping mode is successful, the time zone setting unit 314 sets the time zone data based on the acquired positioning information (latitude, longitude) More specifically, the time zone setting unit 314 selectively acquires and stores the time zone data (time zone information, that is, the time difference information) corresponding to the positioning information from the time zone data storage unit 220 in the time zone data 215.

For example, because Japan Standard Time (JST) is nine hours ahead of UTC (UTC+9), when the acquired positioning information is in Japan, the time zone setting unit 314 reads and stores the time difference information for Japan Standard Time (+9 hours) from the time zone data storage unit 220 to the time zone data 215.

Time Correction Unit

The time correction unit 315 corrects the display time data 214 using the acquired time zone data when the time zone setting unit 314 sets the time zone data. As a result, the display time data 214 goes to the sum time of the internal time data 213, which is UTC, plus the time zone data.

Time Correction Unit

When acquisition of time information by the reception control unit 311 is successful, the time correction unit 316 stores the acquired time information in the received time data 211. As a result, the internal time data 213 and display time data 214 are corrected.

Operating Control Process

The operating control process of the electronic timepiece 10 is described next with reference to the flow chart in FIG. 6.

Figure 6:
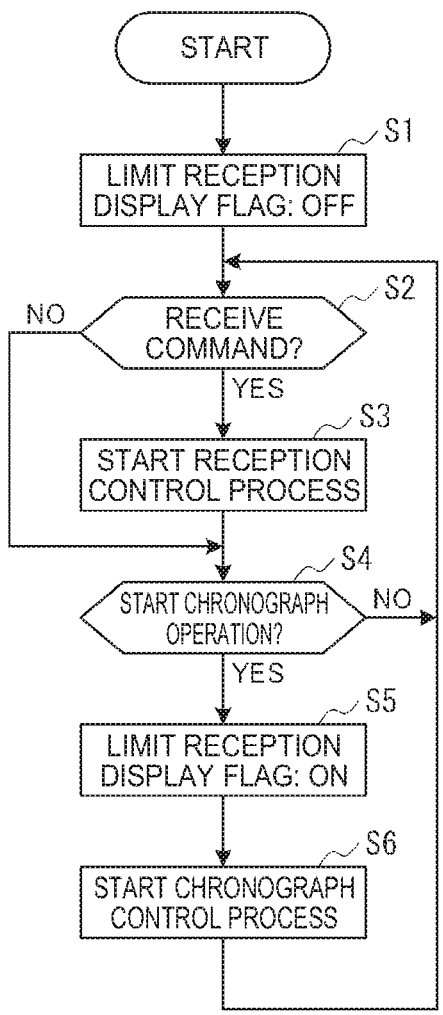
FIG. 6 is a flow chart illustrating the operating control process of the electronic timepiece according to the first embodiment.

As shown in FIG. 6, when the operating control process starts, the operating control unit 313 initializes by turning off the limit reception display flag, which limits displaying information related to the reception process (ON: display limited, OFF: display not limited) (S1). Note that the limit reception display flag is changed to on when the chronograph control process S30 described below starts, and is turned off again when the chronograph control process S30 ends.

Next, the operating control unit 313 determines if a scheduled (automatic) reception process condition is met or if the input device 160 was operated to start the reception process (pressing button B 62 for at least 3 seconds). More specifically, the operating control unit 313 determines whether or not a command to run the satellite signal reception process was asserted (S2).

If step S2 returns YES, the operating control unit 313 starts the reception control process S10 described below (S3). Note that in this event the operating control unit 313 executes reception control process S10 shown in FIG. 7 in parallel to the operating control process shown in FIG. 6.

If S2 returns NO, or if the reception control process S10 starts in S3, the operating control unit 313 determines if the input device 160 was operated to start the chronograph (if button C 63 was pressed) (S4).

Figure 8:
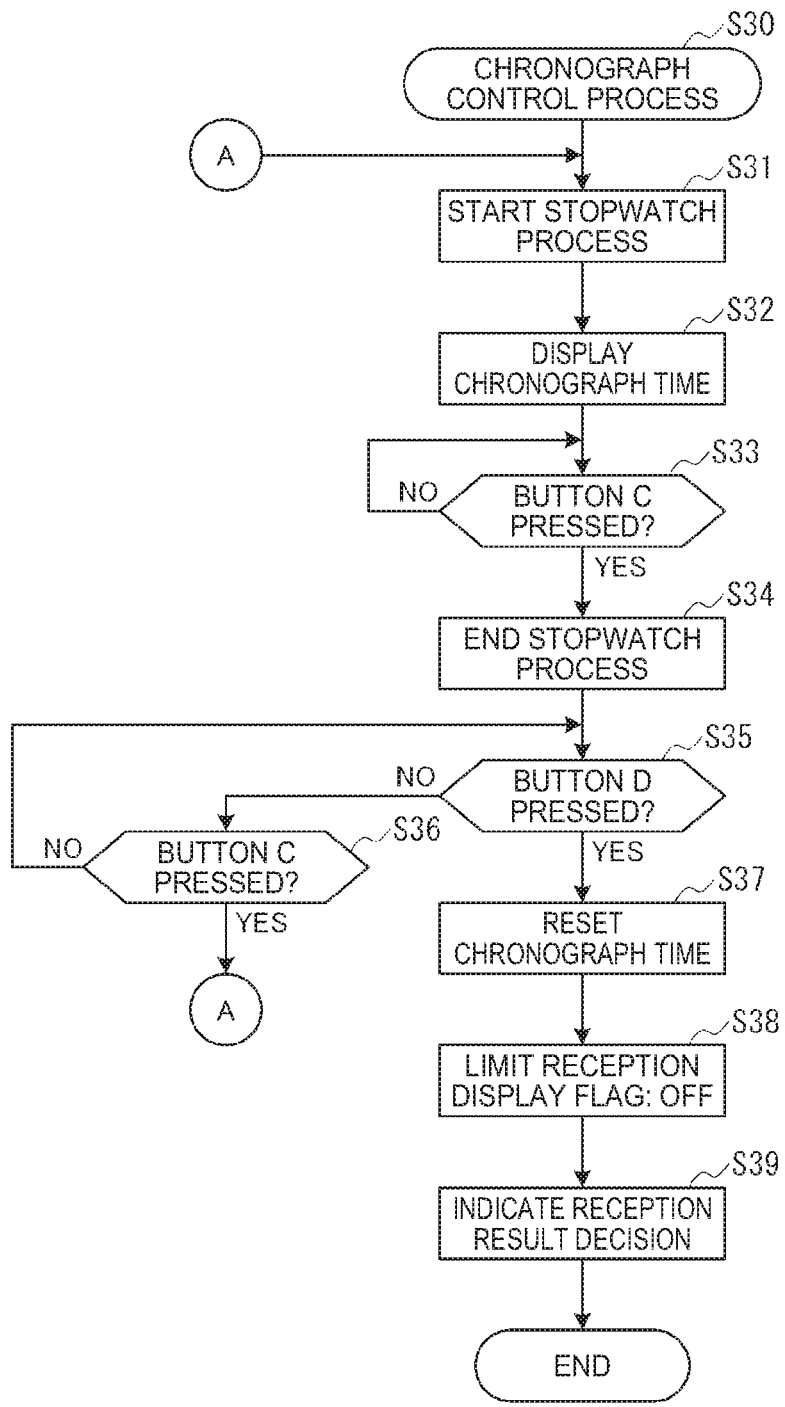
FIG. 8 is a flow chart illustrating the chronograph control process of the electronic timepiece according to the first embodiment.

If S4 returns YES, the operating control unit 313 changes the limit reception display flag to ON (S5), and starts the chronograph control process S30 shown in FIG. 8 (S6). In this case, the operating control unit 313 runs the chronograph control process S30 parallel to the operating control process shown in FIG. 6.

If S4 returns NO, or if the chronograph control process S30 starts in S6, the operating control unit 313 returns to S1. The process of steps S1 to S6 thus repeats while the electronic timepiece 10 is operating.

Reception Control Process

The reception control process S10 is described next with reference to the flow chart in FIG. 7.

Figure 7:
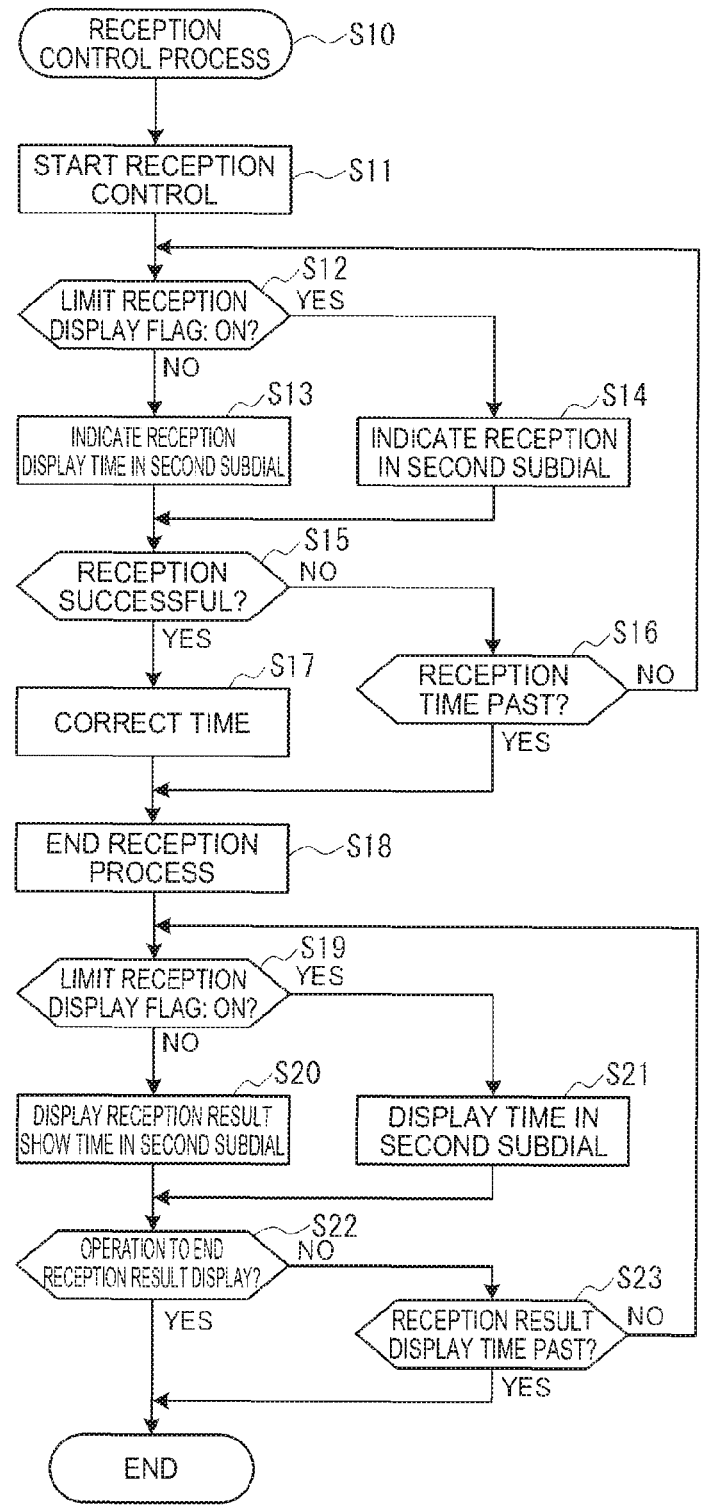
FIG. 7 is a flow chart illustrating the reception control process of the electronic timepiece according to the first embodiment.

As shown in FIG. 7, when the reception control process S10 starts, the operating control unit 313 controls the reception control unit 311 to start the satellite signal reception process (S11).

Next, the operating control unit 313 determines if the limit reception display flag is ON (S12).

Figure 9:
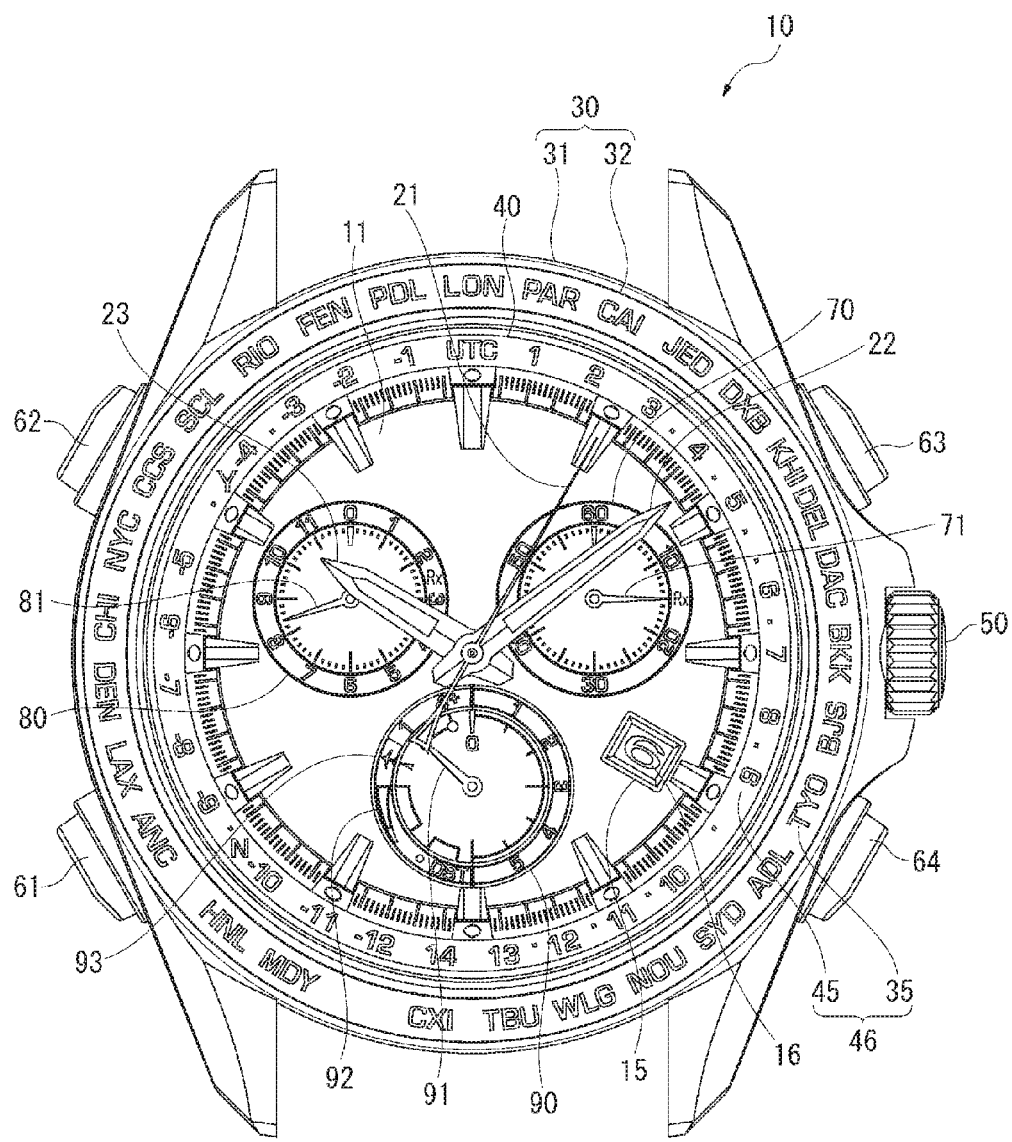
FIG. 9 shows an example of information displayed by the electronic timepiece according to the first embodiment.

If S12 returns NO, the operating control unit 313 sets the second hand 21 to indicate the number of locked satellites as shown in FIG. 9, the hand 71 to the Rx marker indicating satellite signals are being received, and hand 91 to either the 1 indicating the timekeeping mode or the 4+ marker indicating the positioning mode. The operating control unit 313 also sets hand 81 to display the second of the internal time (S13). Note that immediately after the chronograph unit 312 stops operating when the reception control unit 311 and the chronograph unit 312 are operating simultaneously, the hand 81 points to the Rx marker. The operating control unit 313 therefore moves the hand 81 from the Rx marker to the position of the current second in S13.

Figure 10:
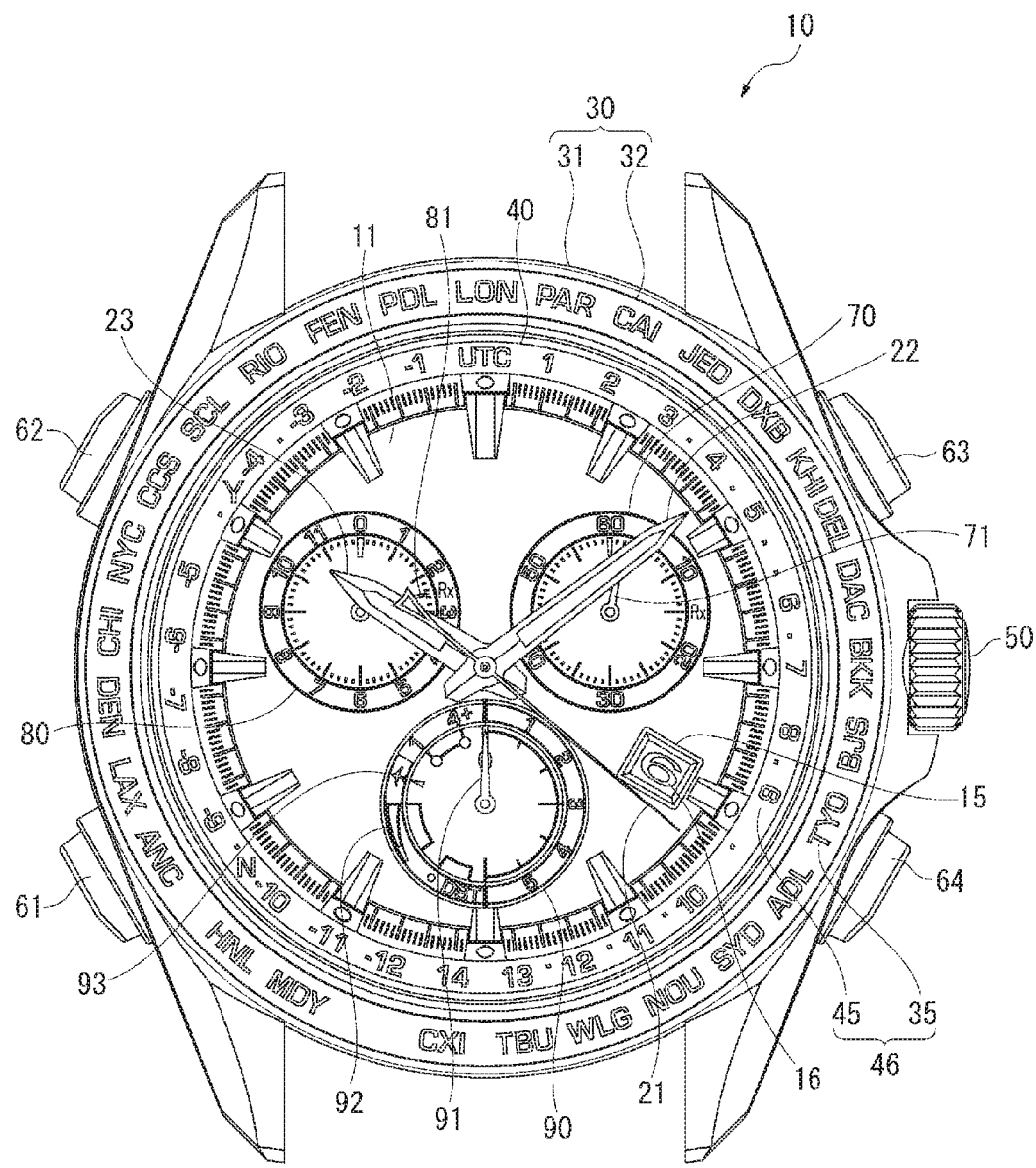
FIG. 10 shows an example of information displayed by the electronic timepiece according to the first embodiment.

If S12 returns YES, the chronograph control process S30 is executing, and as shown in FIG. 10, the hands 21, 71, 91 are indicating the chronograph time. In this event, the operating control unit 313 sets hand 81 to the Rx marker indicating satellite signals are being received. The hands 21, 71, 91 continuing displaying the chronograph time (S14).

After steps S13 and S14, the operating control unit 313 determines if the reception control unit 311 succeeded in receiving satellite signals and acquiring time information in the reception process (S15).

If S15 returns NO, the operating control unit 313 determines if a predetermined reception time has past since the reception process started (S16).

If S16 returns NO, the operating control unit 313 returns to S12. As a result, steps S12 to S16 repeat until the reception time passes unless S15 returns YES.

If S15 returns YES, the operating control unit 313 operates the time correction unit 316 and stores the acquired time information in the received time data 211. As a result, the internal time data 213 and the display time data 214 are corrected (S17).

After S17, or if S16 returns YES, the operating control unit 313 stops operation of the reception control unit 311 and ends the reception process (S18).

Next, the operating control unit 313 determines if the limit reception display flag is ON (S19).

Figure 11:
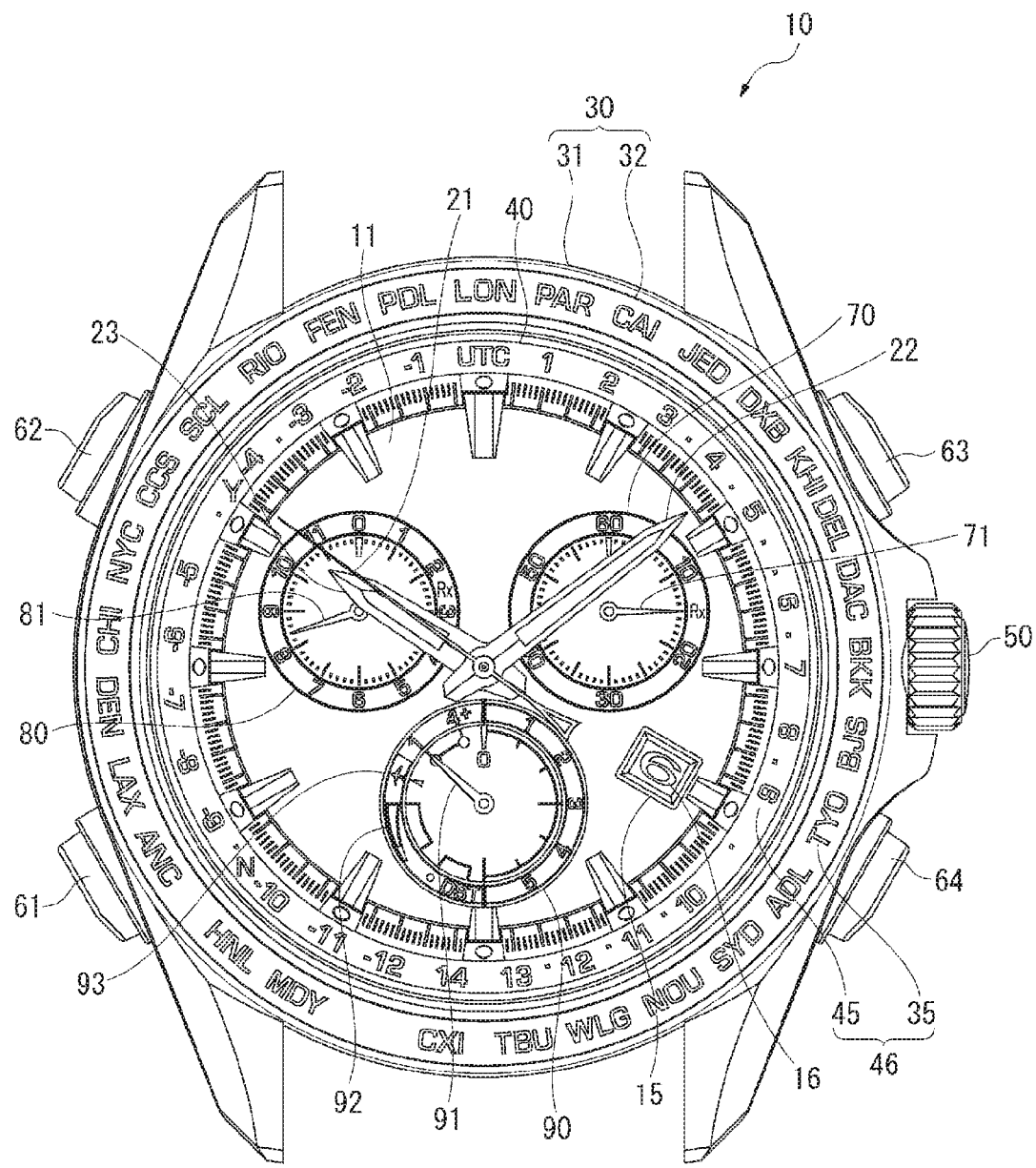
FIG. 11 shows an example of information displayed by the electronic timepiece according to the first embodiment.

If S19 returns NO, the operating control unit 313, as shown in FIG. 11, sets the second hand 21 to the Y or N marker appropriate to the reception result (set to Y in FIG. 11), and moves hand 71 to the 60 marker. The mode hand 91 also goes to the 1 marker indicating the timekeeping mode, or the 4+ marker indicating the positioning mode. The operating control unit 313 also sets hand 81 to the second of the current time (S20).

If S19 returns YES, the chronograph control process S30 is running and the hands 21, 71, 91 display the chronograph time. In this case, the operating control unit 313 also sets hand 81 to the second of the current time. The hands 21, 71, 91 continue displaying the chronograph time (S21).

After S20 and S21, the operating control unit 313 determines if the input device 160 was operated to stop displaying the reception result (if button B 62 was pressed) (S22).

If S22 returns NO, the operating control unit 313 determines if a preset display time has passed since the reception result was indicated (S23).

If S23 returns NO, the operating control unit 313 returns to S19. More specifically, the process of steps S19 to S23 repeats until the display time has past unless S22 returns YES.

If S22 returns YES, or if S23 returns YES, the operating control unit 313 ends the reception control process S10.

Chronograph Control Process

The chronograph control process S30 is described next with reference to the flow chart in FIG. 8.

As shown in FIG. 8, when the chronograph control process S30 starts, the operating control unit 313 operates the chronograph unit 312 and starts the stopwatch process (S31), and as shown in FIG. 10, controls the hands 21, 71, 91 to indicate the chronograph time (S32). If the hands 21, 71, 91 were indicating information related to the reception process when the chronograph function starts, the operating control unit 313 moves the hands 21, 71, 91 quickly to indicate the chronograph time.

Next, the operating control unit 313 determines if button C 63 was pressed (S33).

If S33 returns NO, the operating control unit 313 repeats S33.

If S33 returns YES, the operating control unit 313 stops the chronograph unit 312 and ends the stopwatch process (S34).

Next, the operating control unit 313 determines if button D 64 was pressed (S35).

If S35 returns NO, the operating control unit 313 determines if button C 63 was pressed (S36).

If S36 returns NO, the operating control unit 313 returns to S35. However, if S36 returns YES, the operating control unit 313 returns to S31, operates the chronograph unit 312, and resumes the stopwatch process.

However, if S35 returns YES, the operating control unit 313 resets the chronograph time measured by the chronograph unit 312 (S37). The operating control unit 313 then turns the limit reception display flag OFF (S38).

Next, if the reception control process S10 was executed while the chronograph control process S30 was running, and the reception control process S10 ended first, the operating control unit 313 sets the second hand 21 to indicate the reception result (S39), and ends the chronograph control process S30.

Effect of Embodiment 1

If the chronograph is started while the reception process is executing, the operating control unit 313 drives the chronograph unit 312 and displays the chronograph time with the hands 21, 71, 91. As a result, by operating the input device 160 to start the chronograph, the user can start the stopwatch at the desired time and can read the chronograph time even if the reception process is already running.

Measurement of time must start immediately whenever the user wants to start the stopwatch (measuring time). Furthermore, because information related to the stopwatch function, including the measured time, changes more easily with the passage of time than does information related to the reception process, such as the number of locked satellites, indicating that reception is in progress, the reception mode, and the reception result, when measuring time while checking information related to the measuring process, the user will usually want to be able to continuously check information related to the measuring process while the stopwatch (measuring) process is running. Therefore, by enabling starting the chronograph and viewing information related to the stopwatch process whenever desired, the ease of use of the electronic timepiece 10 can be improved.

Furthermore, because the purpose of the reception process is to display the accurate time, the main objective of the user is not to know information related to the reception process, such as the number of locked satellites, indicating that reception is in progress, the reception mode, and the reception result. The main objective of the stopwatch process, however, is for the user to know information related to the stopwatch process, such as the measured time. The ease of use of the electronic timepiece 10 can therefore be improved by enabling checking information related to the stopwatch process.

Furthermore, because the reception process continues executing while the chronograph unit 312 operates if the chronograph is started while the reception process is running, an opportunity to acquire time information from satellite signals is not lost.

If an automatic reception condition is met or reception is started manually while the chronograph control process S30 is running, the operating control unit 313 operates the reception control unit 311 and starts the reception control process S10. Because the limit reception display flag is ON, S12 returns YES even if the reception control process S10 runs, and information related to the reception process is not displayed by the hands 21, 71, 91 in step S13. As a result, the hands 21, 71, 91 continue to indicating the chronograph time.

As a result, the user can continue to read the stopwatch and know the elapsed time even if an automatic reception condition is met and the reception process runs while the stopwatch is being used.

Furthermore, because the reception process runs if an automatic reception condition is met while the chronograph unit 312 is operating, chances to acquire time information from satellite signals will not be lost.

Note that because the reception control unit 311 executes a light-activated automatic reception process, the likelihood that reception will start when outdoors is strong and there is a relatively high probability of successfully acquiring time information. Furthermore, because time information can be acquired in a relatively short time, the reception control unit 311 operates for a short time, and the time the reception control unit 311 and chronograph unit 312 are operating simultaneously can be shortened. Power can therefore be conserved and the processor load reduced.

If the user wants to run the reception process while using the stopwatch, the user can do so by manually starting the reception process using the input device 160.

Furthermore, because the hands 21, 71, 91 display both information related to the reception process and the chronograph time, the number of hands on the electronic timepiece 10 can be reduced when compared with a configuration having separate hands for displaying information related to the reception process and for displaying the chronograph time.

Furthermore, when the reception process and the chronograph control process S30 are executing simultaneously, and the chronograph control process S30 then ends first, the limit reception display flag is changed to OFF, and NO is returned in the reception control process S10 in S12. Then in S13 the hands 21, 71, 91 change automatically from indicating the chronograph time to indicating information related to the reception process. As a result, without operating the input device 160, the user can get information related to the reception process.

When the reception process and the chronograph control process S30 are executing simultaneously, the reception process ends first, and the chronograph control process S30 then ends, the second hand 21 moves from indicating chronograph time to indicating the reception result. More specifically, if the steps (S19 to S23) following completion of the reception process in the reception control process S10 are executing when the chronograph control process S30 ends, S19 returns NO, and in S20 the second hand 21 moves from indicating chronograph time to indicating the reception result. However, if the reception control process S10 has already ended when the chronograph control process S30 ends, the second hand 21 moves from indicating chronograph time to indicating the reception result in step S39 in the chronograph control process S30. As a result, the user can know the reception result without operating the input device 160.

When the reception process and the chronograph control process S30 are executing simultaneously, the hands 21, 71, 91 indicate the chronograph time, but the user can still know that satellite signals are being received because hand 81 points to the Rx marker indicating satellite signals are being received. The user can therefore avoid actions that may interfere with receiving satellite signals, such as moving from outdoors to indoors or covering the electronic timepiece 10 with something through which satellite signals may not pass. The likelihood of successfully acquiring time information can therefore be improved.

Furthermore, because the hand 81 is also used to indicate the second of the internal time, the number of hands on the electronic timepiece 10 can be reduced and the construction of the electronic timepiece 10 can be simplified when compared with a configuration having a dedicated hand for indicating that satellite signals are being received.

Embodiment 2

In an electronic timepiece according to the second embodiment, the detection device 170 detects a change display operation of the input device 160 to change the information display, and outputs a change display operation signal when a change display operation is detected.

If a change display operation signal is input while the reception process and the chronograph control process are running, the operating control unit 313 causes the hands 21, 71, 91 to switch displaying the information related to the reception process and the chronograph time. Other aspects of this embodiment are the same as the electronic timepiece 10 in the first embodiment described above.

Figure 12:
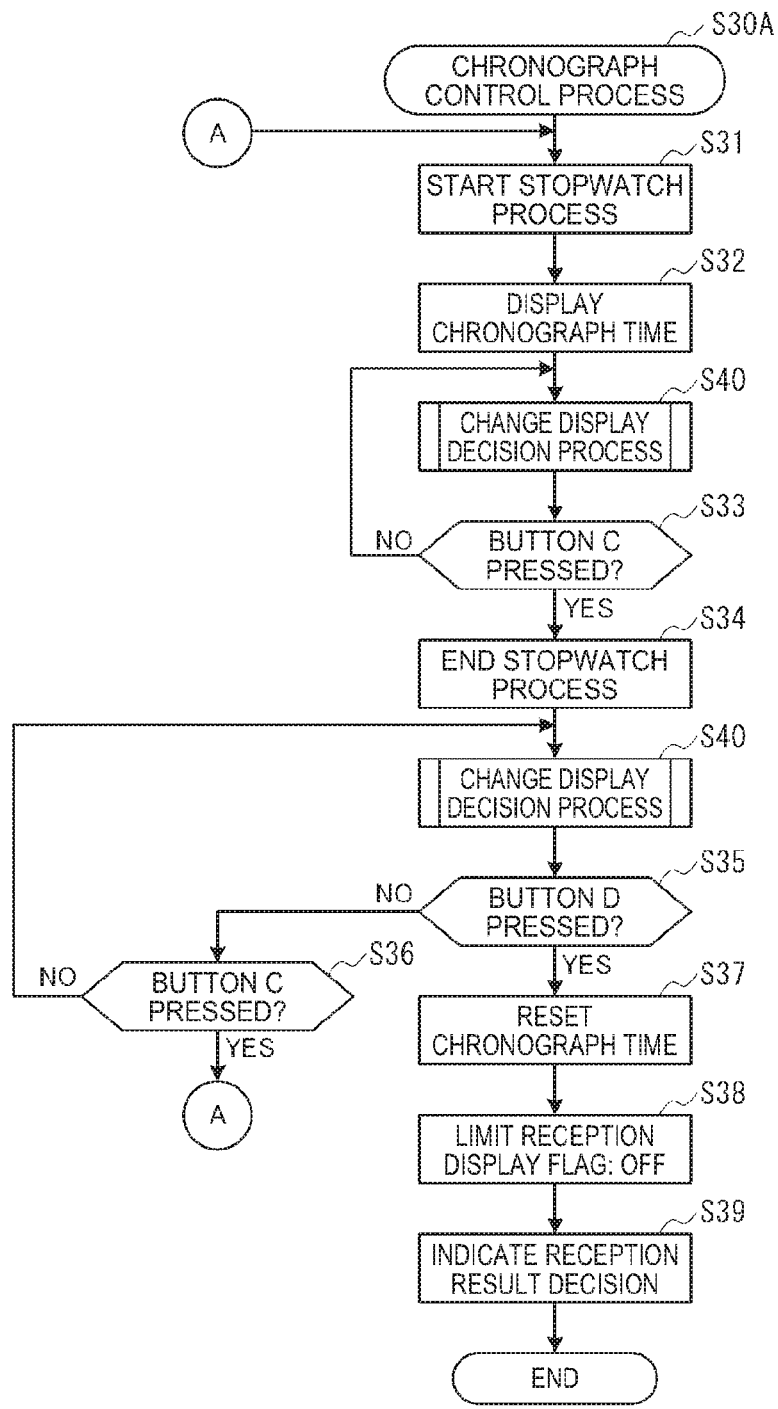
FIG. 12 is a flow chart illustrating the chronograph control process of the electronic timepiece according to the second embodiment.

FIG. 12 is a flow chart of the chronograph control process S30A in the second embodiment. S31 to S39 of the chronograph control process S30A are the same as the chronograph control process S30 of the first embodiment, and further description thereof is omitted.

After step S32, and after step S34, in the chronograph control process S30A, the operating control unit 313 executes the display switching decision process S40.

Figure 13:
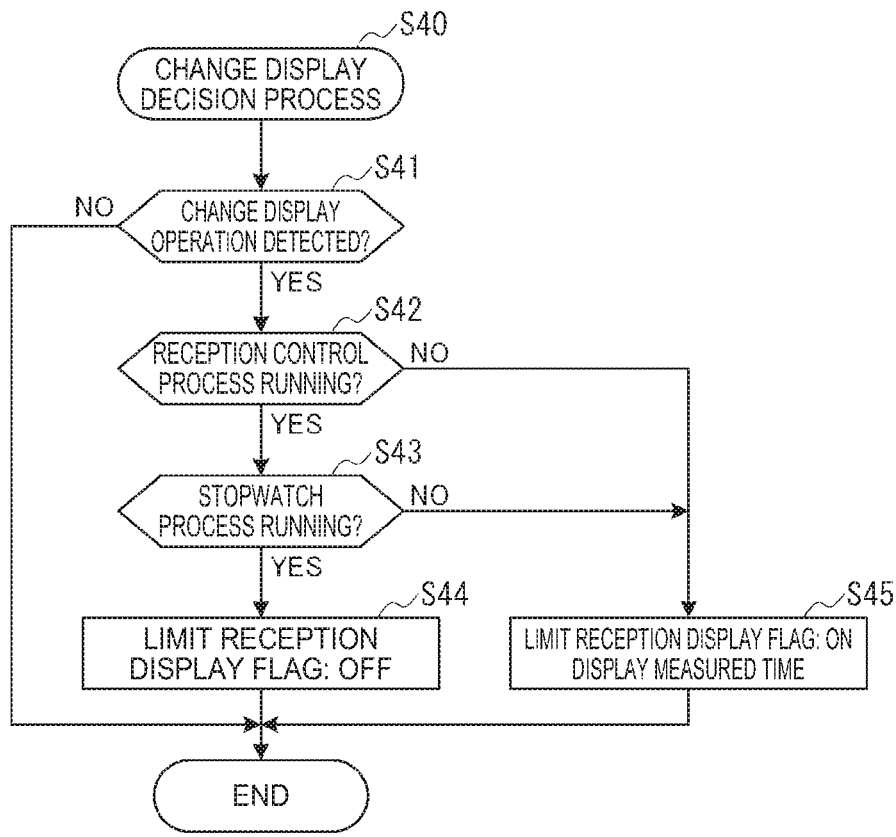
FIG. 13 is a flow chart illustrating the display switching decision process of the electronic timepiece according to the second embodiment.

FIG. 13 is a flow chart of the display switching decision process S40.

As shown in FIG. 13, when the display switching decision process S40 starts, the operating control unit 313 determines if a change display operation was performed with the input device 160 (S41).

If S41 returns NO, the operating control unit 313 ends the display switching decision process S40.

However, if S41 returns YES, the operating control unit 313 determines if the reception control process S10 is running simultaneously to the chronograph control process S30A (S42).

If S42 returns YES, operating control unit 313 determines if the hands 21, 71, 91 are displaying the chronograph time (S43).

If S43 returns YES, the operating control unit 313 changes the limit reception display flag to OFF (S44), and ends the display switching decision process S40. As a result, step S13 or S20 of the reception control process S10 executes, and the hands 21, 71, 91 move to indicate information related to the reception process.

However, if S43 returns NO, that is, if the change display operation was already performed and the hands 21, 71, 91 are indicating information related to the reception process, or if S42 returns NO, the operating control unit 313 changes the limit reception display flag to ON, sets the hands 21, 71, 91 to display the chronograph time (S45), and ends the display switching decision process S40. Note that the hand 81 indicates the second of the internal time if the chronograph control process S30A and the reception control process S10 are not executing simultaneously, and points to the Rx marker indicating reception is in progress if the reception control process S10 is executing.

Effect of Embodiment 2

If the reception process and the chronograph control process S30A are running, the chronograph time is indicated by the hands 21, 71, 91, and the stopwatch will continue running for some time, the user can display and check the information related to the reception process if desired by simply performing the change display operation. The chronograph time can then be displayed again by repeating the change display operation after checking the information related to the reception process.

Embodiment 3

Figure 14:
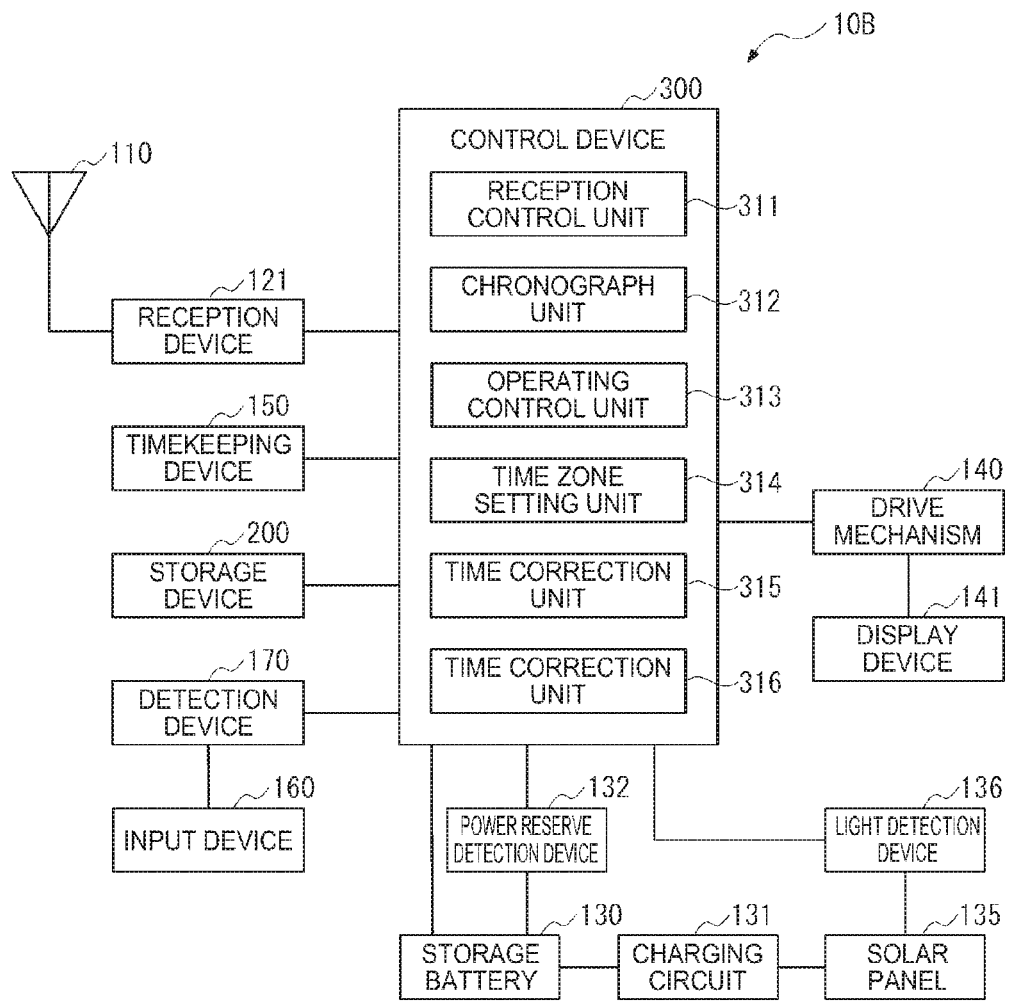
FIG. 14 is a block diagram of the electrical control circuit of the electronic timepiece according to a third embodiment.

As shown in FIG. 14, an electronic timepiece 10B according to the third embodiment also has a power reserve detection device 132 for detecting the remaining battery voltage of the storage battery 130. The power reserve detection device 132 may detect the remaining battery capacity instead of the voltage of the storage battery 130. The power reserve detection device 132 is an example of the battery reserve detection unit.

When a chronograph operation signal is input while the reception control unit 311 is operating, or a command to execute the reception process is input while the chronograph unit 312 is operating, the operating control unit 313 determines if the remaining battery capacity equals or exceeds a specific threshold by comparing the output detected by the power reserve detection device 132 with a previously set threshold.

If the detected value is greater than or equal to the threshold, the operating control unit 313 operates the reception control unit 311 and chronograph unit 312.

If the detected value is less than the threshold, and the reception control unit 311 is operating, the operating control unit 313 stops operation of the reception control unit 311 and starts operation of the chronograph unit 312.

If the detected value is less than the threshold, and the chronograph unit 312 is operating, the operating control unit 313 does not start operating the reception control unit 311.

Other aspects of this embodiment are the same as the electronic timepiece 10 according to the first embodiment.

Figure 15:
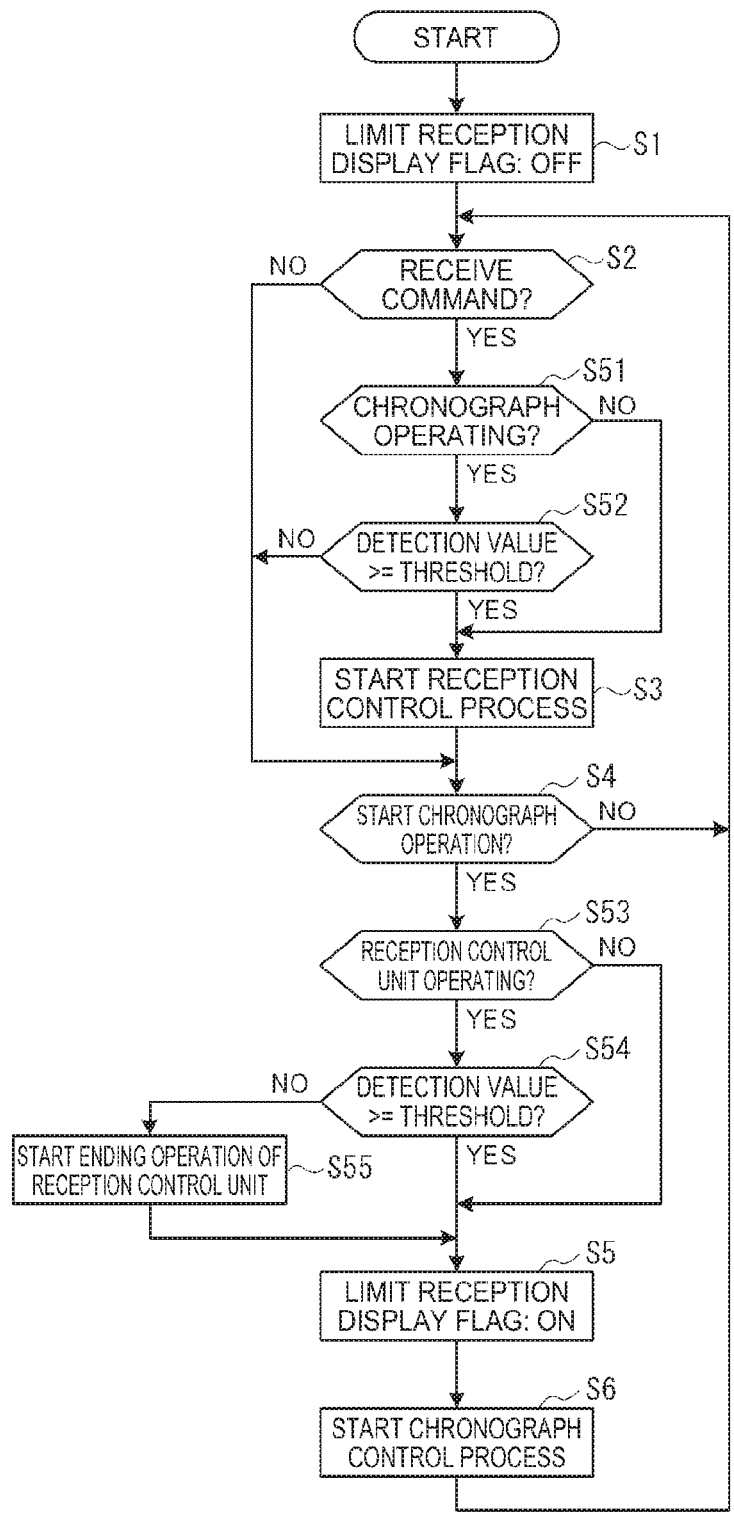
FIG. 15 is a flow chart illustrating the operating control process of the electronic timepiece according to the third embodiment.

FIG. 15 is a flow chart of the operating control process according to the third embodiment. Note that steps S1 to S6 of the operating control process are identical to the operating control process according to the first embodiment, and further description thereof is omitted.

In the operating control process according to the third embodiment, if a command to start the reception process is detected and S2 returns YES, the operating control unit 313 determines if the chronograph unit 312 is operating (S51).

If S51 returns YES, the operating control unit 313 determines if the output from the power reserve detection device 132 is greater than or equal to the threshold (S52). If S52 returns YES, or if S51 returns NO, the operating control unit 313 starts the reception control process S10 in S3.

However, if S52 returns NO, that is, the detected value is less than the threshold, the remaining battery capacity is low, and control goes to step S4 without starting the reception control process S10.

If the input device 160 was operated to start the stopwatch, and S4 returns YES, the operating control unit 313 determines if the reception control unit 311 is operating (S53). If S53 returns YES, the operating control unit 313 determines if the detected output from the power reserve detection device 132 is greater than or equal to the threshold (S54). If S54 returns YES, or if S53 returns NO, the operating control unit 313 changes the limit reception display flag to ON in S5, and in S6 starts the chronograph control process S30.

However, if S54 returns NO, that is, if the detected battery capacity is less than the threshold, the operating control unit 313 starts ending operation of the reception control unit 311. Control then goes to S5 and S6, and the chronograph control process S30 starts.

Effect of Embodiment 3

If the output of the power reserve detection device 132 is less than the threshold, that is, if the storage battery 130 capacity has dropped, the reception control unit 311 and chronograph unit 312 are prevented from operating simultaneously. Because power consumption can therefore be reduced compared with when the reception control unit 311 and chronograph unit 312 operate simultaneously, the electronic timepiece 10 can be prevented from unexpectedly shutting down and the duration time of the storage battery 130 can be increased.

The electronic timepiece 10 is also easier to use because the chronograph unit 312 operates with priority over the reception control unit 311.

The invention is not limited to the embodiments described above, and can be modified and improved in many ways without departing from the scope of the accompanying claims.

In the embodiments described above, the information related to the reception process indicated by the hands 21, 71, 91 includes the number of locked satellites, that reception is in progress, and the reception mode, but the invention is not so limited. For example, the signal level of the satellite signal being received may be indicated. The hands 21, 71, 91 indicate at least one of the number of locked satellites, that reception is in progress, the reception mode, and the signal level of the satellite signal being received.

In the embodiments described above, the information related to the chronograph (stopwatch) process indicated by the hands 21, 71, 91 is the measured time (chronograph time), but the invention is not so limited. More specifically, other information related to the chronograph process may be indicated. Examples of such other information related to the stopwatch process include lap time, split time, and speed.

Lap time is the elapsed time in the next measurement started from the moment measuring the previous elapsed time ends. Split time is the time past from when measurement started to some midpoint in the measurement. Speed is the value calculated from the measured (elapsed) time and a previously set distance.

In the embodiments described above, the second hand 21 is used to display the chronograph second and the number of locked satellites; hand 71 is used to display the chronograph minute and reception; and hand 91 is used to display the chronograph hour and reception mode. The hands may be used in different combinations, however, such as one hand indicating the chronograph minute and the number of locked satellites.

In the foregoing embodiments the hands used in the chronograph operation are all also used to display information in the reception process, but using only one of the hands used for the chronograph operation to also display reception process information is also conceivable. For example, hands 21 and 71 may be used to display chronograph time, while hand 91 is used to display chronograph time and information related to the reception process. In this event, when the display is changed in the second embodiment described above, hands 21 and 71 continue displaying the chronograph time, and only the hand 91 switches between indicating chronograph time and information related to the reception process.

When there is a command to start the reception process while the chronograph control process is running, the operating control unit 313 in the foregoing embodiments moves the hands 21, 71, 91 to display the chronograph time whether the reception process is an automatic reception process or manual reception process, but the invention is not so limited. For example, the hands 21, 71, 91 may indicate information related to the reception process without displaying the chronograph time if a manual reception process is running, but the hands 21, 71, 91 may display the chronograph time if an automatic reception process is running.

Furthermore, the operating control unit 313 continues indicating the chronograph time with the hands 21, 71, 91 when there is a command to start the reception process while the chronograph control process is running, but the invention is not so limited. For example, if the chronograph control process is executing but the stopwatch process has ended, that is, the chronograph unit 312 is not operating, information related to the reception process may be indicated with the hands 21, 71, 91.

If the operation to start the stopwatch is performed while the reception process is executing, the operating control unit 313 in the foregoing embodiments operates the chronograph unit 312 and controls the hands 21, 71, 91 to display the chronograph time.

If the chronograph control process is executing and a command to run the reception process is detected, the operating control unit 313 operates the reception control unit 311 and controls the hands 21, 71, 91 to display the chronograph time. However, the invention is not so limited. More specifically, the operating control unit 313 may execute only one process at a time.

If the reception process and the chronograph control process are running simultaneously and the chronograph control process ends first, the operating control unit 313 in the foregoing embodiments indicates information related to the reception process with the hands 21, 71, 91, but the invention is not so limited. More specifically, the hands 21, 71, 91 may be controlled to always display the time instead of information related to the reception process.

If the reception process and the chronograph control process are running simultaneously, the reception process ends first, and the chronograph control process then ends, the operating control unit 313 in the foregoing embodiments displays the reception result with the second hand 21, but the invention is not so limited. More specifically, the operating control unit 313 may not indicate the reception result with the second hand 21.

When the reception process and the chronograph control process are running simultaneously, the operating control unit 313 controls the hand 81 to indicate that satellite signals are being received, but the invention is not so limited. More specifically, the operating control unit 313 could not indicate that satellite signals are being received.

Furthermore, in addition to when the reception process and the chronograph control process are running simultaneously, the operating control unit 313 may control the hand 81 to indicate that satellite signals are being received when the reception process is executing but the chronograph control process is not. In this event, the hand 71 may not indicate that reception is in progress, and a single hand may be used to indicate if satellite signals are being received.

The hand 81 in the foregoing embodiments is used to indicate that satellite signals are being received and to indicate the second of the internal time, but the invention is not so limited. More specifically, the hand 81 may be used to indicate that satellite signals are being received and to indicate the minute or hour of the internal time or other information. A display unit such as an LCD display may also be used instead of the hand 81.

The time measuring unit is embodied by the chronograph unit 312 in the foregoing embodiments, but the invention is not so limited. More specifically, the time measuring unit may be a countdown timer that counts the time down from a preset time, for example.

The foregoing embodiments are described with reference to a GPS satellite 100 as an example of a positioning information satellite, but invention is not so limited. Other examples of positioning information satellites include Global Navigation Satellite Systems (GNSS) such as Galileo (EU), GLONASS (Russia), and Beidou (China). The invention can also be used with geostationary satellites in satellite-based augmentation systems (SBAS), and quasi-zenith satellites in radio navigation satellite systems (RNSS) that can only search in specific regions. The invention can also be used in configurations that receive and process satellite signals from multiple systems.

The invention being thus described, it will be obvious that it may be varied in many ways. Such variations are not to be regarded as a departure from the spirit and scope of the invention, and all such modifications as would be obvious to one skilled in the art are intended to be included within the scope of the following claims.

The entire disclosure of Japanese Patent Application No. 2015-20244, filed February, 2015 is expressly incorporated by reference herein.

What is claimed is:

1. An electronic timepiece comprising:
   a reception unit configured to receive satellite signals; a reception control unit configured to operate the reception unit and execute a reception process;
   a measurement unit configured to execute a measuring process to measure time;
   an operating unit;
   a detection unit configured to detect a measurement operation of the operating unit instructing execution of the measuring process, and to output a chronograph operation signal when the measurement operation is detected;
   a hand used to indicate information related to the reception process and to indicate information related to the measuring process; and
   a control unit configured to operate the measurement unit in addition to simultaneously operating the reception control unit such that the reception process and the measuring process operate simultaneously, and to control operation of the hand to switch from indicating the information related to the reception process to indicate the information related to the measuring process if the chronograph operation signal output from the detection unit is input while the reception process is running.

2. The electronic timepiece described in claim 1, wherein:
   if the reception process and the measuring process are executing and the measuring process ends, the control unit controls operation of the hand to indicate the information related to the reception process.

3. The electronic timepiece described in claim 1, wherein:
   the control unit controls operation of the hand to indicate the reception result of the reception process if the reception process and the measuring process are executing, the reception process ends, and the measuring process ends after the reception process ends.

4. The electronic timepiece described in claim 1, further comprising: a display unit configured to indicate that satellite signals are
   being received, and to display information other than that satellite signals are being received;
   the control unit controlling the display unit to display that satellite signals are being received when the reception process and the measuring process are running.

5. The electronic timepiece described in claim 1, further comprising: an operating unit; and
   a detection unit configured to detect a change display operation of the operating unit that instructs changing the display;
   the control unit controlling operation of the hand to switch displaying the information related to the reception process and the information related to the measuring process if the change display operation output from the detection unit is input while the reception process and the measuring process are running.

6. The electronic timepiece described in claim 1, further comprising: a battery; and
   battery reserve detection unit configured to detect the battery voltage or the remaining capacity of the battery;
   wherein if the reception control unit is operating and a signal instructing operation of the measurement unit is input, or if the measurement unit is operating and a signal instructing operation of the reception control unit is input or a condition for operating the reception control unit is met, the control unit compares the detection value of the battery reserve detection unit with a previously set threshold, operates the reception control unit and the measurement unit if the detection value is greater than or equal to the threshold, ends operation of the reception control unit and starts operation of the measurement unit if the detection value is less than the threshold, and does not start operation of the reception control unit if the detection value is less than the threshold and the measurement unit is operating.

7. An electronic timepiece comprising:
a reception unit configured to receive satellite signals; a reception control unit configured to operate the reception unit and execute a reception process;
a measurement unit configured to execute a measuring process to measure time;
a hand used to indicate information related to the reception process and to indicate information related to the measuring process; and
a control unit configured to operate the reception control unit in addition to simultaneously operating the measurement unit such that the reception process and the measuring process operate simultaneously, and to control operation of the hand to indicate the information related to the measuring process if a condition to automatically receive the satellite signal is met while the measuring process is running.

8. The electronic timepiece described in claim 7, further comprising: a light detection unit configured to detect the amount of light
incident to the electronic timepiece;
the condition to automatically receive the satellite signal being the amount of light detected by the light detection unit being greater than or equal to a specific light level.

9. The electronic timepiece described in claim 7, further comprising: an operating unit; and
a detection unit configured to detect a receive operation of the operating unit instructing executing the reception process, and output a reception operation signal when the receive operation is detected;
the control unit operating the reception control unit in addition to the operating measurement unit, and controlling the hand to indicate the information related to the measuring process, if the reception operation signal output from the detection unit is input while the measuring process is running.

10. A control method of an electronic timepiece including a reception unit configured to receive satellite signals, a reception control unit configured to operate the reception unit and execute a reception process, a measurement unit configured to execute a measuring process to measure time, an operating unit, a detection unit configured to detect a measurement operation of the operating unit instructing executing the measuring process, and outputting a chronograph operation signal when the measurement operation is detected, and a hand used to indicate information related to the reception process and to indicate information related to the measuring process, the control method comprising:
simultaneously operating the measurement unit with the operating reception control unit such that the reception process and the measuring process operate simultaneously, and controlling operation of the hand to switch from indicating the information related to the reception process to indicate the information related to the measuring process if the chronograph operation signal is output from the detection unit while the reception process is running.

* * * * *